United States Patent [19]

Kawahara et al.

[11] Patent Number: 5,694,358
[45] Date of Patent: Dec. 2, 1997

[54] NONVOLATILE SEMICONDUCTOR MEMORY DEVICE

[75] Inventors: Takayuki Kawahara; Yusuke Jyouno; Syunichi Saeki; Naoki Miyamoto; Katsutaka Kimura, all of Tokyo, Japan

[73] Assignees: Hitachi, Ltd., Tokyo; Hitachi Device Engineering Co., Ltd., Mobara, both of Japan

[21] Appl. No.: 706,267

[22] Filed: Sep. 24, 1996

[30] Foreign Application Priority Data

Sep. 4, 1995 [JP] Japan ................... 7-226230

[51] Int. Cl.[6] .................................. G11C 7/00
[52] U.S. Cl. ................ 365/185.08; 365/189.05; 365/203; 365/63
[58] Field of Search ............. 365/185.08, 189.05, 365/203, 205, 207, 208, 63

[56] References Cited

U.S. PATENT DOCUMENTS 5,331,600  7/1994  Higuchi ................ 365/189.05
5,590,073  12/1996  Arakawa et al. .......... 365/185.08
5,610,859  3/1997  Nakamura et al. ......... 365/189.05

FOREIGN PATENT DOCUMENTS 5-159586  6/1993  Japan.

OTHER PUBLICATIONS

T. Tanaka et al., "High-Speed Programming and Program-Verify Methods Suitable for Low-Voltage Flash Memories", 1994 Symposium on VLSI Circuits Digest of Technical Papers.

Primary Examiner—David C. Nelms
Assistant Examiner—Vu A. Le
Attorney, Agent, or Firm—Antonelli, Terry, Stout, & Kraus, LLP

[57] ABSTRACT

This invention provides a nonvolatile semiconductor memory device having a word line, a plurality of bit lines crossing the word line, and a plurality of memory cells including MOS transistors. Each of control gates of the MOS transistors are coupled to the word line and each of drains thereof are coupled to the bit lines, respectively. Each of the MOS transistors also has a floating gate. Further, the non-volatile semiconductor memory device comprises latch circuits, first switches, a sense amplifier coupled to the plurality of bit lines in common, and second switches. The latch circuits are coupled to the plurality of bit lines through the first switches which are coupled between the plurality of bit lines and the latch circuits, respectively. The second switches are respectively coupled between the plurality of bit lines and the sense amplifier, thereby coupling the sense amplifier to the bit lines. Each of the plurality of first switches includes a MOS transistor whose source-drain path is between a corresponding one of the plurality of bit lines and a corresponding one of the latch circuits, respectively. When data is to be read from a memory cell selected out of the plurality of memory cells, the plurality of first switches are turned off and one of the second switches between the selected memory cell and the sense amplifier is turned on.

18 Claims, 24 Drawing Sheets

FIG. 4
|  | LATCH CIRCUIT | SENSE AMPLIFIER |
|---|---|---|
| OPERATION | DIGITAL | ANALOG |
| GATE LENGTH | SHORT | LONG |
| LAYOUT | EASY | DIFFICULT |
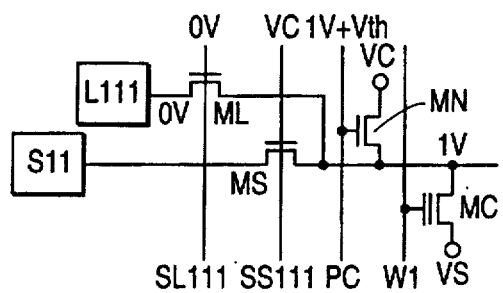
FIG. 5A(1)
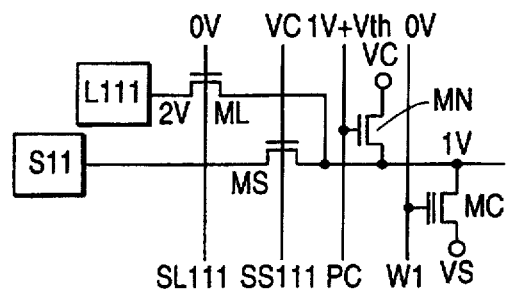
FIG. 5A(2)
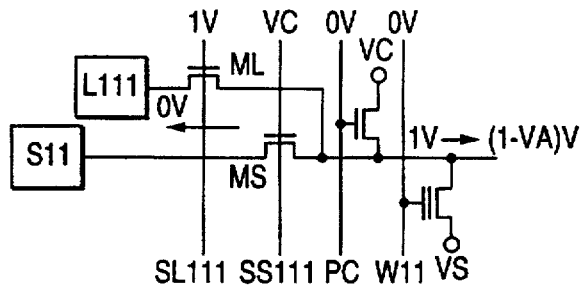
FIG. 5B(1)
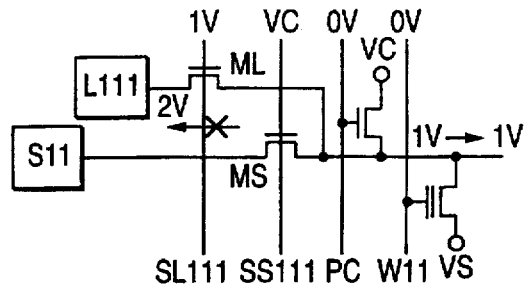
FIG. 5B(2)

FIG. 6A(1)
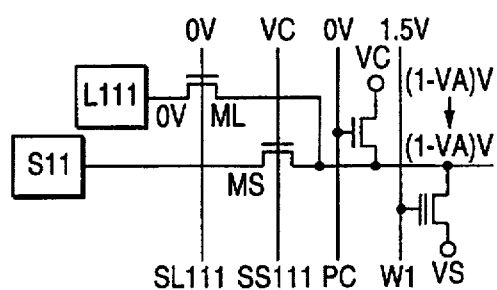
FIG. 6A(2)
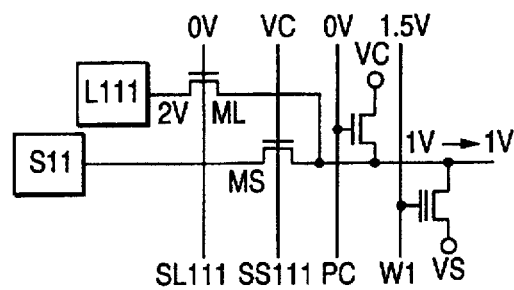
FIG. 6B(1)
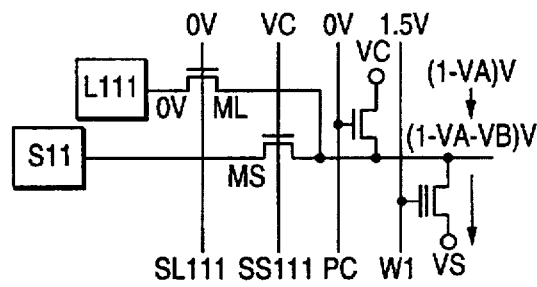
FIG. 6B(2)
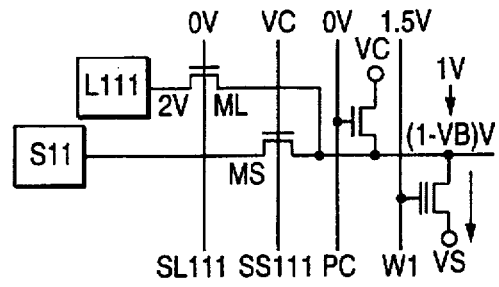

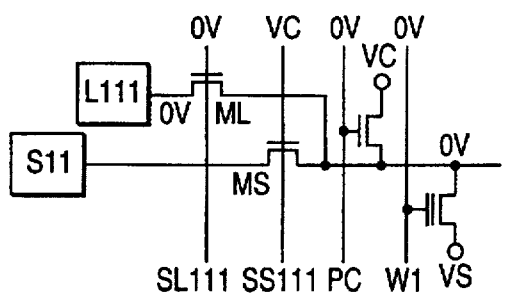
FIG. 7A(1)
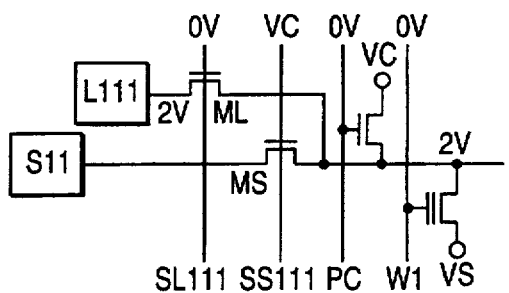
FIG. 7A(2)
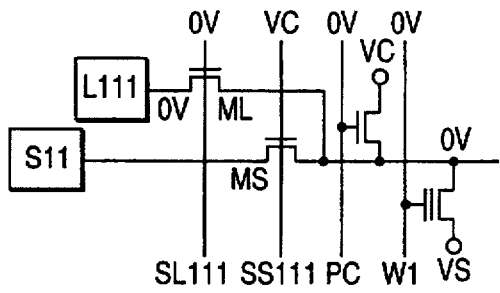
FIG. 7B(1)
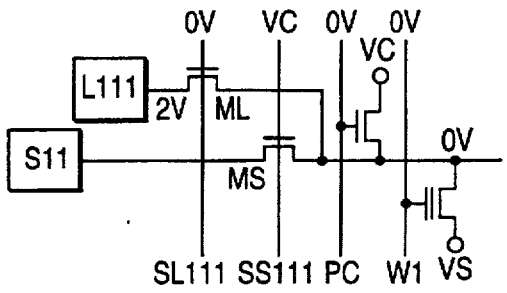
FIG. 7B(2)

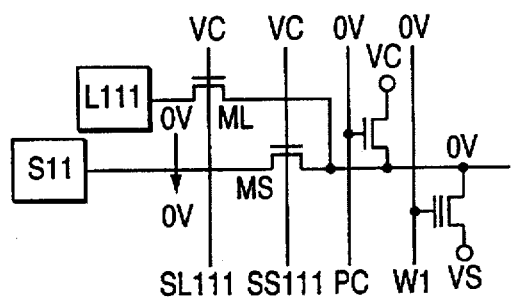
FIG. 8A(1)
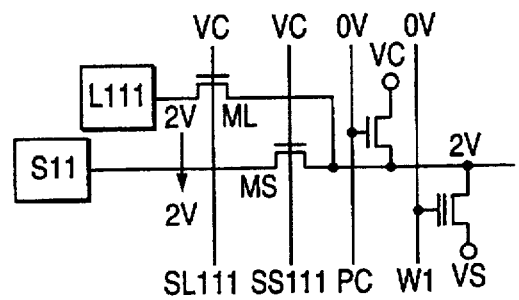
FIG. 8A(2)
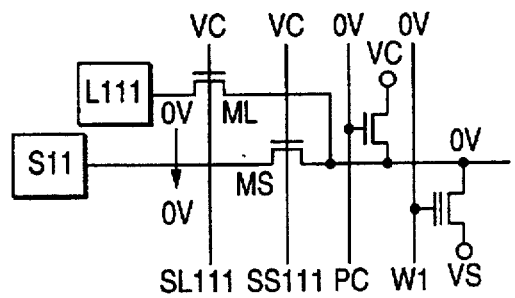
FIG. 8B(1)
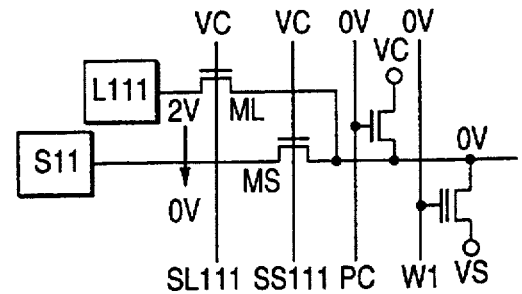
FIG. 8B(2)
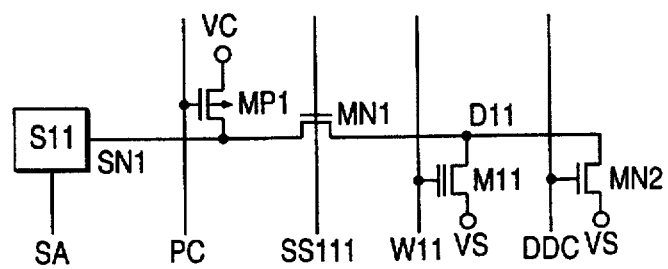
FIG. 9

|  | ERASE | WRITE | READ |
|---|---|---|---|
| D11 | 0V | 4V / 0V | 1V |
| SD | -4V | 7V | Vcc |
| W11 | 12V | -9V | 2V |
| SS | Vcc | 0V | Vcc |
| CS | -4V | 0V | 0V |
| VWE | -4V | 0V | 0V |
| BS11 | -4V | F | — |
| BD11 | -4V | 4V / 0V | — |

NONVOLATILE SEMICONDUCTOR MEMORY DEVICE

BACKGROUND OF THE INVENTION

The present invention relates generally to semiconductor memory devices, and, more particularly, to technology for laying out a sense system of a flash memory easily and for high-speed sensing.

Nonvolatile semiconductor memories are now widely used in many kinds of electric equipment. Generally, it is known that the nonvolatile semiconductor memory has lower operation speed than a volatile memory, and that the nonvolatile semiconductor memory is larger than the volatile memory. However, recently high speed and high density for nonvolatile semiconductor memory devices has begun to be demanded as their use in electric equipment has increased.

One of the conventional techniques to speed up the operation of nonvolatile semiconductor memory devices is disclosed in the article entitled "High-Speed Programming and Program-Verify Methods Suitable for Low-Voltage Flash Memories" by Tanaka et al in 1994 SYMPOSIUM ON VLSI CIRCUITS, DIGEST OF TECHNICAL PAPERS, pp. 61–62. FIG. 30 corresponds to FIG. 5(a) in Tanaka et al. In FIG. 30, there is a sense latch SL that serves both as a sense amplifier as well as a latch circuit for writing. This sense latch SL is disposed for a bit line BL connected to a memory cell MC. The bit line BL and an IO terminal of the sense latch SL are connected to each other through a MOS transistor M2 controlled by a signal TR. A MOS transistor M1 is connected between a MOS transistor M3 and BL. The gate of M3 is connected to the IO terminal of the sense latch. M1 is controlled by control signal PG. When M1 is turned on by PG, data written into MC depends upon the state of the sense latch, i.e., SL turns on M3 and a signal VSA is supplied to BL through M1 when SL latches "H" data. This makes it possible to verify each of the bits and to decrease the distribution of threshold voltages of the memory cells after writing, as disclosed in the above-mentioned literature. MD is an MOS transistor which is controlled by a signal DDC to discharge the bit line, and another MOS transistor controlled by a signal SET is the one for so setting SL that the IO terminal first assumes a high level. VSA is a power source of the sense latch and VWEL is a power source of a well of the memory cell. According to the reference as described above, M1 to M3 and SL have been arranged for each of the bit lines BL. In the sense operation, the bit line BL is charged in advance, and then discharged through a memory cell MC. A voltage difference is amplified by the sense latch SL and is read out.

Another reference is Japanese Laid Open Application 5-159586. This discloses a word line, a plurality of bit lines crossing the word line, a plurality of memory cells connected to the bit lines respectively, latch circuits connected to the bit lines, respectively, and a sense amplifier commonly connected to the bit lines.

SUMMARY OF THE INVENTION

From their studies of the prior art, the inventors have found the following problems.

As the memory cells are developed to smaller sizes, it becomes more difficult to accomplish matching between a pitch of laying out the memory cells and a pitch of laying out the peripheral circuits. In particular, technology has been forwarded such that memory cells can be fabricated more finely and more easily, however, the fine fabrication of the memory cells makes it difficult to bring the layout of the inherently complex peripheral circuits into match with the layout of the finely fabricated memory cells. Particularly, difficulty is involved in laying out the peripheral circuits for directly driving the memory cells or for reading out the signals from the memory cells. This is the case, for example, in the aforementioned Tanaka et al article.

Though Japanese Laid Open Application 5-159589 discloses a common sense amplifier, it doesn't teach any solution to the layout problem. Moreover, a reset signal is necessary to cut a connection between the bit line and a write circuit and this necessitates a complicated control method.

Furthermore, if it is attempted to decrease the number of peripheral circuits, i.e., to decrease the number of sense amplifiers that read signals from the memory cells and to connect an increased number of memory cells to each sense amplifier in order to decrease the chip area, then, parasitic capacitance of the bit lines increases. Therefore, if such a reduction in sense amplifiers is applied to the conventional system in which a bit line is precharged by a precharge circuit and is discharged by a current of a memory cell, more time would be required to discharge the bit line by the memory cell, i.e., it would take a longer time to start the sense amplifying operation. This becomes a serious problem, particularly when the power source voltage is lowered to decrease the consumption of power and to improve reliability, since the reading current of the memory cell decreases. Moreover, even if one does decrease the number of sense amplifiers, it is impossible to decrease the number of latch circuits. Thus, it is difficult to reduce the chip area only by decreasing the number of sense amplifiers.

In order to solve these problems, in the present invention, the sense amplifier and the latch are separately provided, a gate length of a MOS transistor of said latch circuit is made shorter than a gate length of a MOS transistor of the sense amplifier, and the sense amplifier is connected to a plurality of bit lines in common through respective switches. Moreover, in order to simplify the control method, switches are disposed between the bit lines and the latch circuits respectively. Furthermore, in order to speed up the start of the sense amplifying operation, an MOS transistor switch is disposed between the sense amplifier and the memory cell, and the bit line on the side of the memory cell is precharged with a voltage which is lower than the gate voltage of the MOS transistor by a threshold voltage thereof.

Since the sense amplifiers and the latches are separately provided, it is allowed to independently design the sense amplifiers to mainly perform the analog operation and the latches to mainly perform the digital operation. That enables the sense amplifiers to use MOS transistors having a long gate length, e.g., 2 µm, and the latch circuits to use MOS transistors having a short gate length, e.g., 0.4 µm. This means that the long gate length allows more dispersion during the production than a short one. The digital operation on the other hand is not as sensitive to the dispersion. Besides, each of the sense amplifiers is shared by a plurality of bit lines through respective switches. Therefore, the pitch of the sense amplifiers becomes a multiple of the pitch of the memory cells, thereby facilitating the operation for layout. As a result, the chip size can be reduced by using the short gate MOS transistors for the latch circuits.

Moreover, since the latch circuits can be separated from the bit lines by the switches, it is unnecessary to reset the latch circuits. This enables reusing the information stored in the latch circuits for verifying or the like without the need for complicated reset circuits required in the aforementioned Japanese Laid Open Application 5-159589.

Furthermore, since the bit line is precharged with a voltage which is lower than the gate voltage of the MOS transistor by a threshold voltage thereof, the bit line on the side of the memory cell is maintained at the precharged potential. Thus, when the memory cell is turned on and begins discharging the bit line, electric carriers are supplied to the bit line through the MOS transistor from a node on the side of the sense amplifier to keep the bit line potential at the precharged potential. This means that voltage change at the node is large because parasitic capacitance at the node is a small. In other words, there is no need to discharge the bit line having a large parasitic capacitance, but instead only the parasitic capacitance on the side of the sense amplifier from the MOS transistor. This makes it possible to increase the speed of a sensing operation.

BRIEF DESCRIPTION OF DRAWINGS

The present invention will be more apparent from the following detailed description, when taken in conjunction with the accompanying drawings, in which:

FIG. 4 is a diagram comparing the latch with the sense amplifier according to the first embodiment;

FIGS. 5A and B are the second embodiment which relates a verification operation of the data stored in memory cells and the data in the latches;

FIGS. 6A and B show results after a word line being selected;

FIGS. 7A and B show results after the sense amplifiers' amplifying;

FIGS. 8A and B show results after the gate voltage of ML is set to be VC;

FIG. 9 is a diagram illustrating a third embodiment of the present invention;

DETAILED DESCRIPTION OF THE PREFERRED EMBODIMENTS

Figure 1:
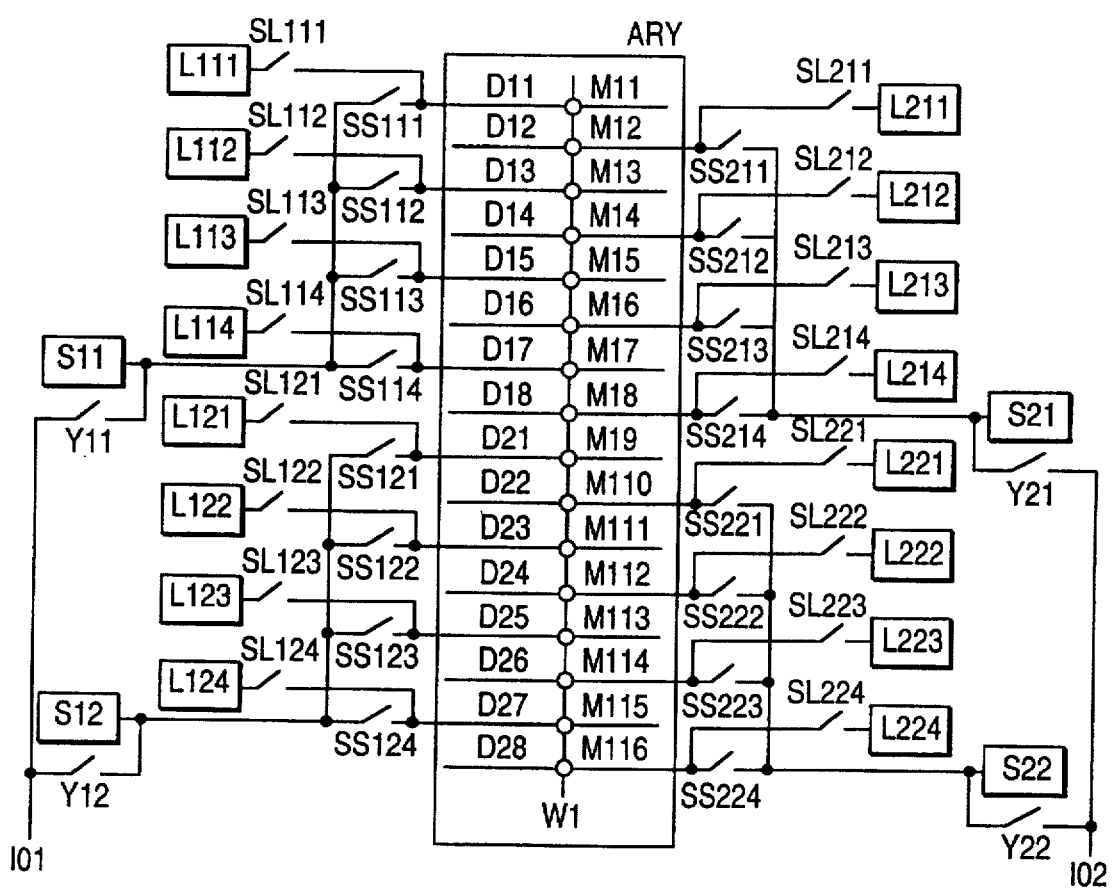
FIG. 1 is a diagram illustrating a first embodiment of the present invention.

FIG. 1 is a diagram illustrating a first embodiment of the present invention. Reference numerals D11 to D28 denote bit lines. Memory cells M11 to M116 are arranged at points where the bit lines cross a word line W1. In practice, a plurality of such word lines are arranged and memory cells that are two-dimensionally arranged are selected using word lines and data lines. Reference numerals S11 to S22 denote sense amplifiers for amplifying currents of the memory cells. Each sense amplifier is shared by four bit lines through four of the switches SS111 to SS224. The sense amplifiers are disposed at the right and left side of the memory array ARY. The bit lines are alternately connected to the sense amplifiers on the right and left sides of the memory cell array ARY, i.e., odd bit lines D11, D13, D15, D17 are connected to the sense amplifier S11 on the left side of the array ARY and even bit lines D12, D14, D16, D18 are connected to the sense amplifier S21 on the right side of the array ARY. Therefore, the sense amplifiers are arranged maintaining a pitch of eight bit lines. This facilitates the layout of the sense amplifiers. The bit lines are connected through switches SL111 to SL224 to latches L111 to L224 in a one-to-one manner. This means that the latches can be separated from the bit lines to maintain stored information when the latches are unnecessary. Data to be written into memory cells are stored in the latches. Voltages corresponding to the data in the latches are simultaneously applied to the memory cells in order to shorten the writing time. Each latch simply holds a voltage corresponding to 1 or 0, and requires less attention in regard to symmetry of parasitic capacitance or resistance in the layout or dispersion in the production than the sense amplifiers. According to the present invention in which the latches and sense amplifiers are provided independently of each other as described above, it is allowed to lay out the latches for each of the bit lines because the latches have short gate length MOS transistors. Signals amplified by the sense amplifiers are sent to a main amplifier in a subsequent stage (not shown in FIG. 1) through Y-selection switches Y11–Y22 and IO lines IO1 and IO2.

Figure 2:
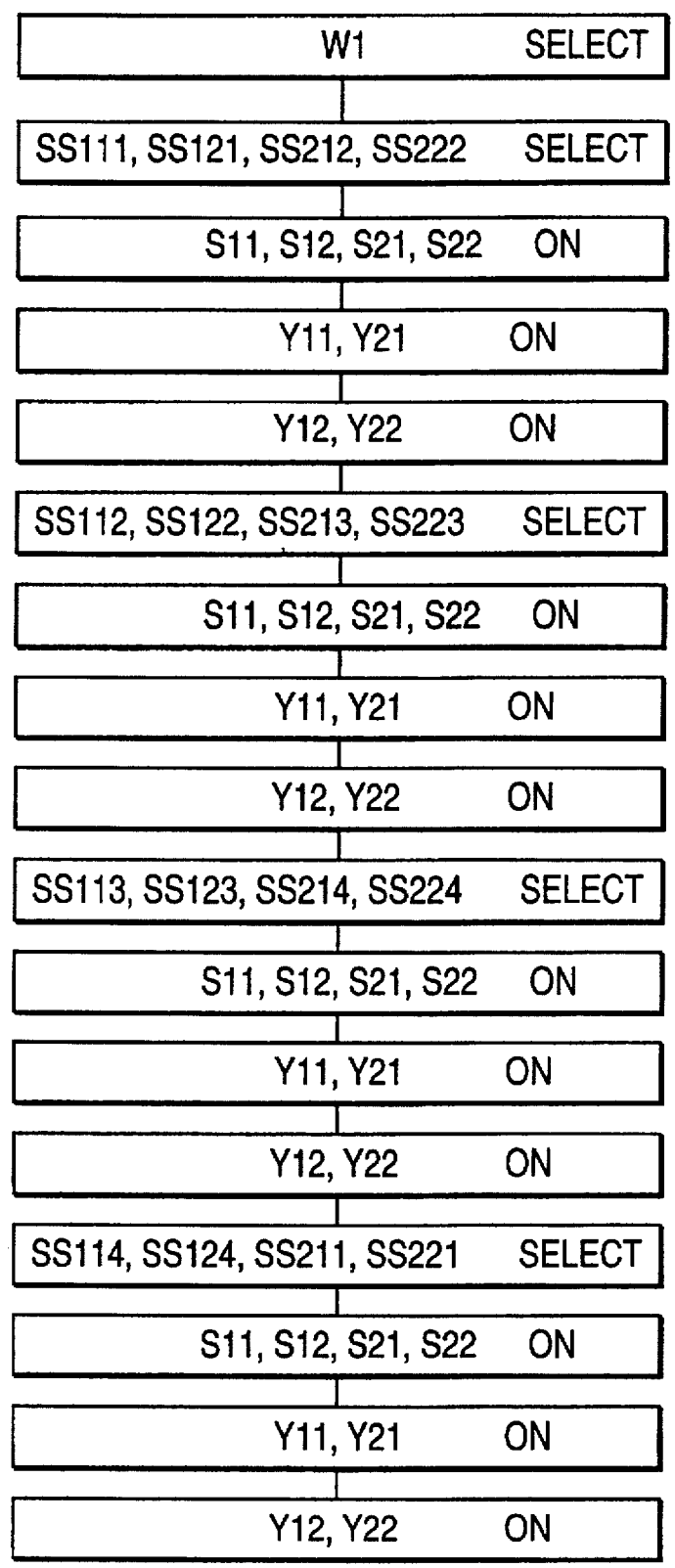
FIG. 2 is a diagram illustrating a reading sequence of the present invention.

FIG. 2 is a diagram illustrating a reading sequence of the present invention. The feature of this embodiment is that a sense amplifier is shared by a plurality of bit lines and, hence, signal amplification by the sense amplifier and transfer onto an IO line are repeated a number of times equal to the number of the bit lines sharing the sense amplifier. The neighboring bit lines are not selected when the right and left sense amplifiers are activated. This makes it possible to decrease interference among the bit lines. This is particularly effective in a system in which all of the bit lines are discharged by the memory cells as shown in FIG. 1.

First, a word line W1 is selected followed by the selection of the switches SS111, SS121, SS212 and S222. Thus, bit lines D11, D14, D21 and D24 are connected to the sense amplifiers S11, S12, S21 and S22, and data of memory cells M11, M14, M19 and M112 appear on the bit lines, respectively. Thereafter, the sense amplifiers S11, S12, S21 and S22 are turned on to amplify the signals on the bit lines. In this case, prior to amplifying the signals, the switches SS111, SS121, SS212 and SS222 can be turned off, and the signals may be amplified after large capacitances of the bit lines have been cut off by the switches. After sufficiently large signals are obtained by the sense amplifiers, the Y-selection switches Y11 and Y21 are switched to transfer the signals of M11 and M14 onto the IO lines IO1 and IO2. Successively, the Y-selection switches Y12 and Y22 are switched to transfer the signals of M19 and M112 onto the IO lines IO1 and IO2. The signals on the IO lines are transferred to the main amplifiers in a subsequent stage where the signals are amplified again and are output. After the transfer the signals to the IO lines is finished, the next memory cells M13, M16, M111 and M114 are read out by selecting switches SS112, SS122, SS213 and SS223. Thus, bit lines D13, D16, D23 and D26 are connected to the sense amplifiers, and the signals thereon are amplified by the sense amplifiers and are transferred onto the IO lines. Afterwards, the signals of other memory cells are amplified and transferred repetitively in the same manner as shown in FIG. 2. The operation may be carried out while keeping the word line selected or may be carried out while selecting the word line each time for the sense amplifier operation. Owing to the above-mentioned operation, the data of memory cells selected by a word line W1 can be read out.

Figure 3:
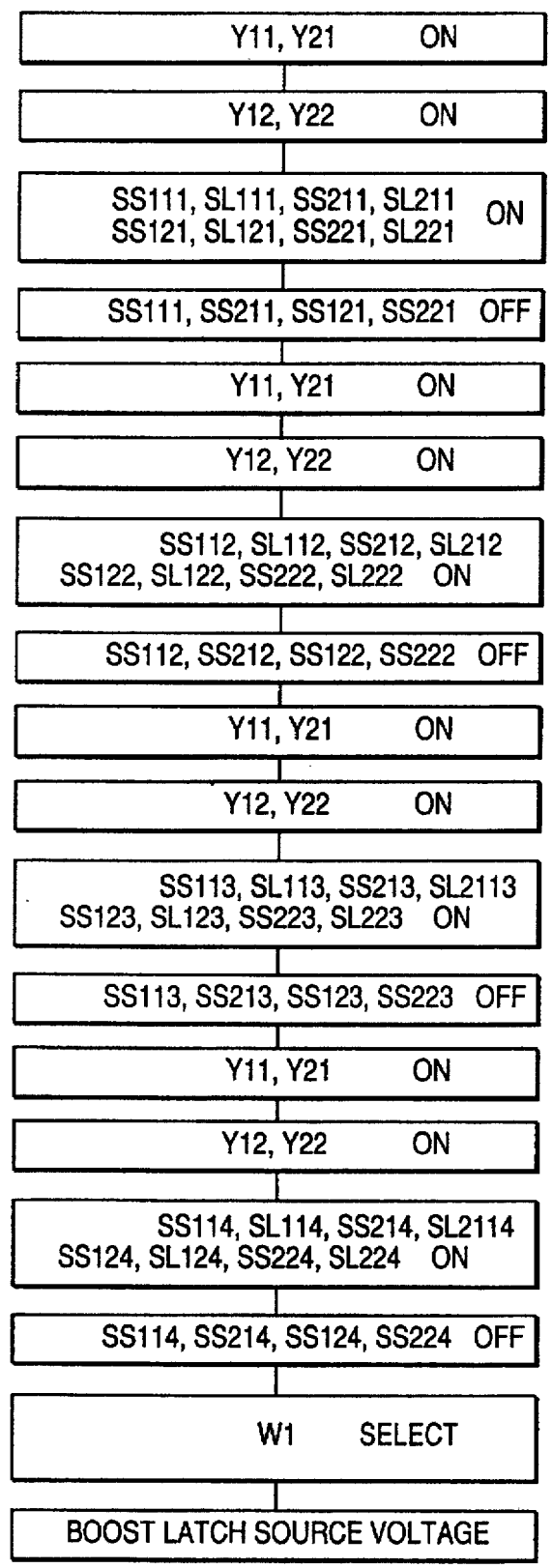
FIG. 3 is a diagram illustrating a writing sequence.

FIG. 3 is a diagram illustrating a writing sequence. The operation for writing data into the sense amplifiers through the IO lines and for transferring the data stored in the plurality of sense amplifiers to the latches, is repeated a number of times equal to the number of the bit lines sharing a sense amplifier in order to store the data in all of the latches. Then, a voltage corresponding to the data in all latches is applied to the memory cells simultaneously. The concrete operation thereof is as follows. First, switches Y11 and Y21 are turned on. Thus, the data on the IO lines are loaded into the sense amplifiers S11 and S21. Then, switches Y11 and Y21 are turned off and switches Y12 and Y22 are turned on, so that the next data on the IO lines are loaded into the sense amplifiers S12 and S22. Though there are only two sense amplifiers such as S11 and S12 connected an IO line IO1 in FIG. 1, the above-mentioned operation in practice is repeated a number of times equal to the number of sense amplifiers connected an IO line. The data in the sense amplifiers are then transferred to the latches by turning on switches SS111, SL111, SS211, SL211, SS121, SL121, SS221 and SL221. At this moment, the bit lines D11, DD12, D21 and D22 are at the voltage corresponding to the data in the sense amplifiers; i.e., these voltages can be directly applied to the memory cells M11, M12, M19 and M110. Next, the sense amplifiers are disconnected from both the latches and the bit lines connected to the latches. To do this, the switches SS111, SS211, SS121 and SS221 are turned off while the switches SL111, SL211, SL121 and SL221 are maintained turned on. This operation is repeated a number of times equal to the number of the bit lines sharing the sense amplifier in the same manner. In this case, four bit lines are sharing a sense amplifier so that the operation is repeated four times (see FIG. 3). Due to this operation, the data are stored in all of the latches. Then, a voltage is applied to the word line W1, and switches, which will be mentioned later, are turned on to connect the bit lines with the memory cells. Accordingly, voltages are applied to the memory cells from the word lines and the bit lines, and data are written into the memory cells depending upon the voltages on the bit lines. In this case, as shown in FIG. 3, the power source voltage for the latches may be boosted in order to boost the voltages on the bit lines during W1 applying voltage to the memory cells. In other words, the applied voltage to each bit line is changed between the former half and the latter half of one time of the writing pulse. This makes it possible to decrease adverse effects caused by overshooting or to decrease a large writing tunnel current at the start of the writing cycle. After the writing operation is finished, the latches are cut off from the bit lines to discharge the bit lines, then the word line is non-selected. Thereafter, a verification operation is carried out. This will be described later with reference to FIGS. 5A and 5B and subsequent drawings.

One of the features of the present invention is that the latches and sense amplifiers are provided independently of each other. Though this was described in the foregoing, the effects obtained will be described below with reference to FIG. 4. In particular, it is to be noted that the latch is involved mainly in the digital operation and the sense amplifier is involved mainly in the analog operation.

When it is attempted to shorten the gate, in general, it has been known that dispersion in the threshold voltage increases due to dispersion in the production process. Dispersion in the threshold voltage is not desirable since the threshold voltage greatly affects the sensing ability of the sense amplifier. In the sense amplifier, therefore, the gate must be sufficiently long (e.g., 2 μm) to minimize the effect of dispersion in the production process. In considering resistance and parasitic capacitance, it is furthermore difficult to lay out the sense amplifier because its layout must be accomplished maintaining good symmetry. On the other hand, the function of the latch is mainly simply to hold the written data. So, the effect of dispersion in the production process doesn't matter for the latches. Therefore, the gate length of MOS transistors for these latches may be short (e.g., 0.4 μm) and it is easy to lay out the latches. According to a conventional technique in which the latches and the sense amplifiers are fabricated as a unitary structure, the gate possesses a large length to maintain the sense amplifier function. However, according to the present invention in which the latches and sense amplifiers are separated from each other, the gate of the MOS transistor in the latch is shortened, thereby decreasing the chip area in comparison with the conventional structure. Further, if the sense amplifiers are provided in the same number as the latches, the area increases by an area of the sense amplifiers. According to the present invention, therefore, the sense amplifier is shared by a plurality of bit lines. Regarding this sharing, it is to be noted that, in the present invention, the memory cells are nonvolatile and do not require rewriting, unlike DRAMs. Therefore, there is no problem in sharing the sense amplifiers.

FIGS. 5A and 5B show the second embodiment which relates a verification operation of the data stored in memory cells and the data in the latches. A flash memory performs the verification for every bit as explained with reference to the aforementioned Tanaka article. FIGS. 5A and B show the verification which follows the writing operation of FIG. 3. The feature of this embodiment is that the latches are handled as second memory cells; i.e., the data in the latches are read out onto the bit lines and, then, the memory cells are read out. Furthermore, a gate voltage is specified for the MOS transistor that connects the latch to the bit line. First, as shown in FIG. 5A, after a first writing pulse is applied to the bit line, the bit line is precharged for the verification.

Two cases are shown in FIG. 5A: a first case where the latch output is 0V and a second case where it is 2V. These voltages are only examples. Data is written when the latch output is 2V, whereas no data is written when the latch output is 0V. In the precharging, the gate voltage of MOS transistor ML connecting the latch to the bit line is set to be 0V to turn it off, and the gate voltage of MOS transistor MS connecting the sense amplifier to the bit line is set to be VC to turn it on for both of the cases. Therefore, SL111 is 0V and SS111 is VC. In this state, a voltage 1V+Vth is applied to the gate of a precharging MOS transistor MN. The Vth is a threshold voltage of MN. Accordingly, the bit line is precharged to nearly 1V.

Referring to FIG. 5B, the latched data is transferred to the bit line. In this case, a voltage on the bit line is not the same as the latch output voltage. First, 1V is given to the gate of ML that connects the latch to the bit line. In case (1) The latch output of 0V corresponds to the source voltage of ML. Since the drain voltage of ML which is the precharging voltage of bit line is 1V and the gate voltage of ML is 1V, the transistor ML is turned on and the bit line is discharged to (1−VA) V, where VA is a certain voltage which depends on characteristics of ML. On the other hand, in case (2) the latch output of 2V corresponds to the drain voltage. Since the gate voltage of ML is 1V and the source voltage which is the precharging voltage of bit line is 1V, the voltage across the gate and the source of ML becomes 0V, and ML is turned off. Therefore, the voltage of the bit line remains 1V.

Next, the memory cell is read out after the precharging in FIGS. 5A and B. At this time, ML has already been turned off. The word line voltage varies depending upon the threshold voltage of a memory cell that is to be verified. In FIGS. 6A and B, for example, the voltage of the word line is 1.5V. FIG. 6A shows the case where the memory cell has a high threshold voltage equal to or greater than 1.5V, where VS is 0V. FIG. 6B shows the case where it has a low threshold voltage smaller than 1.5V. FIG. 6B means a case where the data has already been written into the memory cell enough, i.e., a case where the threshold voltage has dropped to a predetermined voltage. Each of FIGS. 6A and B has (1) a case where the latch output is 0V and (2) a case where it is 2V.

First, when the memory cell has a high threshold voltage (FIG. 6A), no current flows into the memory cell. Therefore, the bit line voltage remains unchanged. When the latch output is 0V, (1−VA) V on the bit line is maintained. When the latch output is 2V, 1V on the bit line is maintained. When the memory cell has a low threshold voltage (FIG. 6B), the charge of the bit line is discharged, and the bit line voltage changes. When the latch output is 0V, therefore, the voltage at the bit line is changed to (1−VA−VB) V and when the latch output is 2V, it is changed to (1−VB), where VB is a certain voltage which depends on a characteristics of the memory cell. Then, the sense amplifier performs amplification.

The results are shown in FIGS. 7A and B. The voltage is amplified to 2V only when the latch output is 2V and the threshold voltage is high. Otherwise, the voltage after amplification is 0V. The case where the voltage is amplified to 2V is the one where the memory cell has a high threshold voltage and the data should be written. Other cases are those where writing of the data is finished or no data should be written. Therefore, the bit lines of the other cases are at 0V. After verifying this, the sense amplifier is disconnected from the bit line, and a rewriting operation is performed. However, in the case of FIG. 7B(2), the voltage on the bit line will be 2V after the bit line is connected to the latch circuit, then the memory cell will be over written. To prevent this problem, the latch circuit is connected to the bit line by VC applying to ML while the sense amplifier is connected to the bit line. The sense amplifier changes the stored voltage in the latch circuit.

FIGS. 8A and B show results after the gate voltage of ML is set to be VC. The latch outputs change to the same as the voltage of the bit lines respectively because of the sense amplifiers. Thereafter, the sense amplifier is cut off. The sense amplifier is also shared by other bit lines and latches. Therefore, the same operation as the one mentioned above is performed for other bit lines and latches. After the verification operation is finished for all latches and bit lines, the sense amplifier is cut off. In this state, the bit lines have already been connected to the latches, and a necessary bit line voltage to rewrite has been applied thereto. While maintaining this voltage or after amplifying the voltage to a desired voltage, the word line is selected and switches for selecting the bit lines and memory cells are selected. Then, the rewriting operation is executed. The bit line voltage may be changed as shown in FIG. 3.

FIG. 9 is a diagram illustrating a third embodiment of the present invention. The feature of this embodiment is that the electric charge of the bit line D11 is partly, but not completely, discharged when the memory cell is turned on. To do this, an MOS transistor MN1 is provided between the bit line and the sense amplifier S11. The gate signal is denoted by SS111, and MN1 also works as a switch of the same reference numeral of Embodiment 1. Moreover, an MOS transistor MP1 for performing precharging is provided at a node SN1 where MN1 and sense amplifier are connected together. The gate signal is denoted by PC. An MOS transistor MN2 for discharging is provided at an end of D11 and its gate signal is denoted by DDC. SA denotes a starting signal of the sense amplifier.

Figure 10:
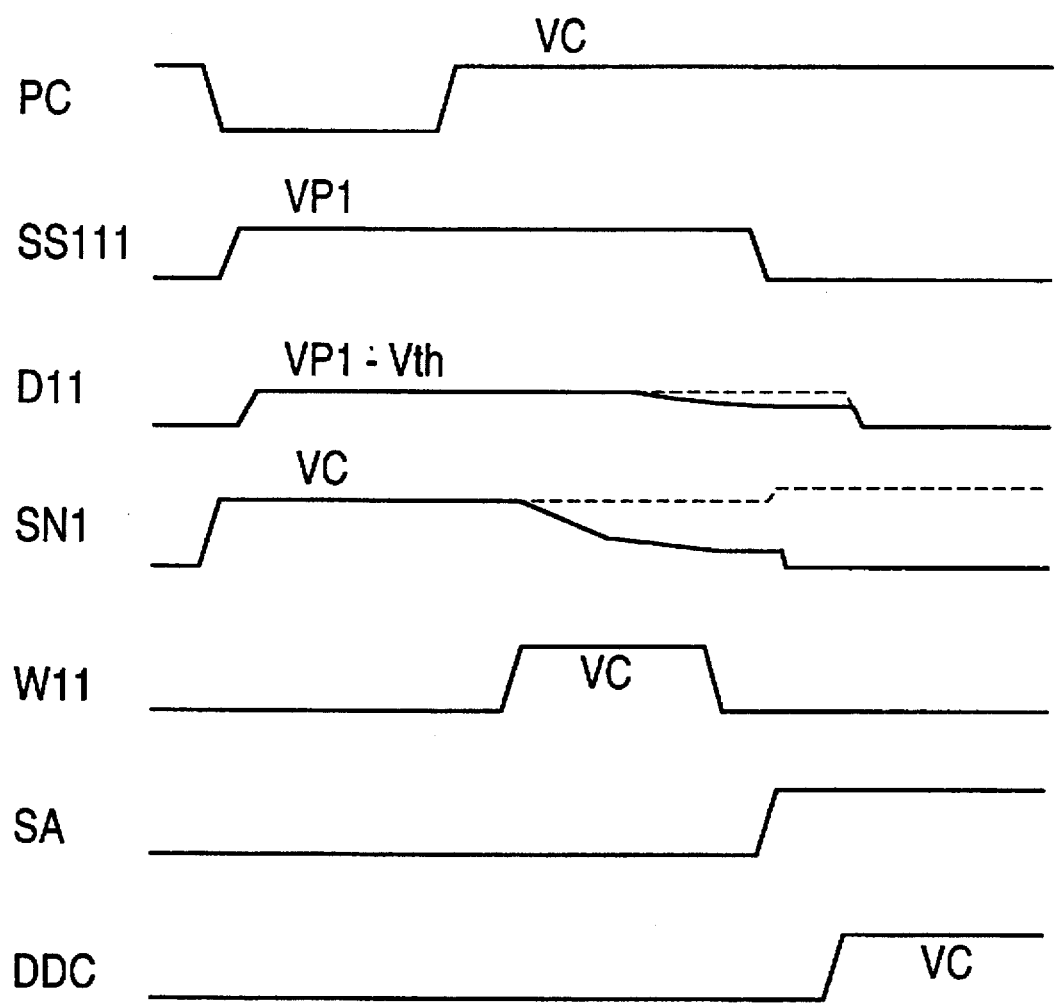
FIG. 10 shows voltage waves of the signals in FIG. 9.

FIG. 10 shows voltage waves of the signals in FIG. 9. It is presumed that D11 and SN1 have been discharged in the preceding cycle. First, PC is changed from a high level to a low level, and SS111 is at a level VP1. VP1 is the same as or is lower than VC. Then, SN1 is charged up to VC. A drain of MN1 is connected to SN1, the gate is connected to SS111 and the source is connected to D11. Accordingly, D11 is precharged to VP1−Vth which is lower than the voltage VP1 of SS111 by the threshold voltage Vth of MN1. In this state, PC is changed to the high level to turn MP1 off and then the word line W11 is selected. If the threshold voltage of the memory cell is low, a current flows into the memory cell so that the level of D11 decreases. However, the voltage of SN1 is higher than that of D11, so D11 is charged by a current through MN1 and maintained at its level of VP1−Vth. Accordingly, the level of D11 does not change very much, and the level of SN1 changes much more than that of D11. This operation continues as long as the level of SN1 remains higher than D11. Accordingly, sensing can start very rapidly because discharging SN1 having a small parasitic capacitance requires very little time. Moreover, it is unnecessary to discharge the bit line D11 having a large parasitic capacitance completely. This saves energy. After the word line is non-selected, SS111 is set to the low level to electrically disconnect SN1 from D11. Thereafter, SA is changed to the high level to activate the sense amplifier. Only the node of SN1 is amplified. Thus, the sense amplifier can amplify at high speeds while consuming only small amounts of electric power. During the sense amplifying operation, DDC is changed over to turn MN2 on and to discharge the bit line D11.

Figure 11:
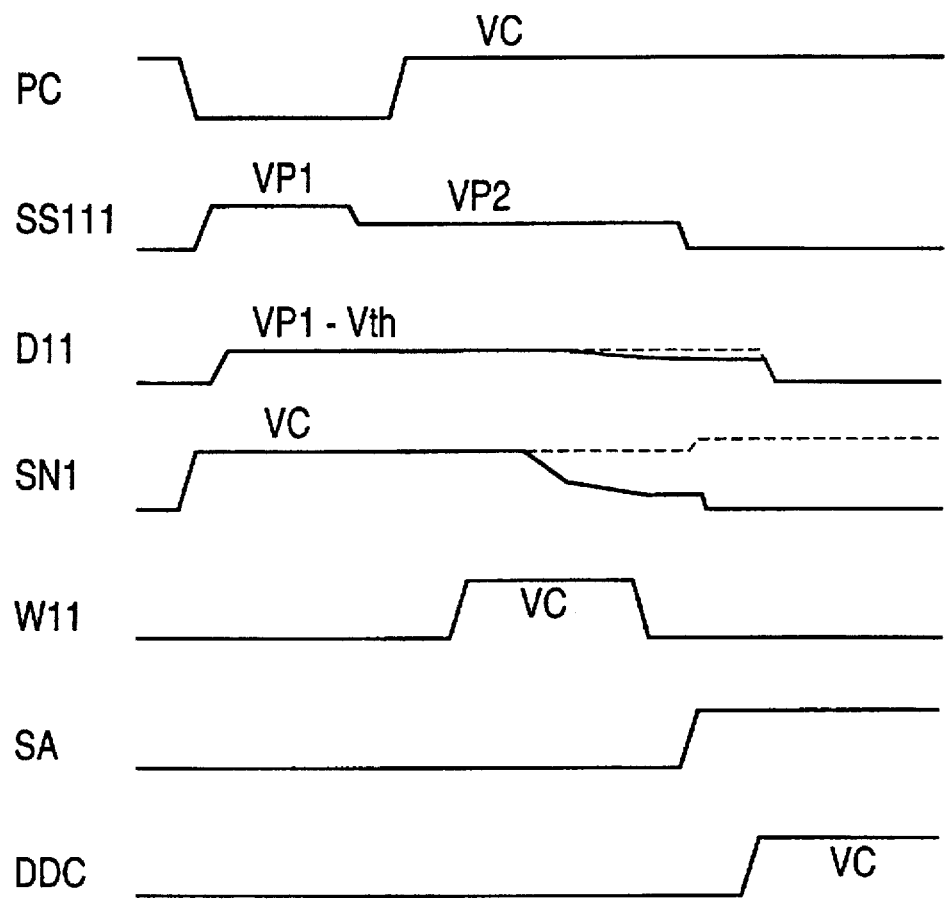
FIG. 11 shows alternative voltage waves of the signals in FIG. 9.

FIG. 11 shows alternative voltage waves of the signals in FIG. 9. What differs from FIG. 10 is that the voltage of SS111 is lowered from VP1 down to VP2 after the precharging has been finished. The reason is because D11 is precharged into VP1–Vth by MN1 but the threshold voltage Vth undergoes a change depending upon the amount of current, etc. Therefore, even after the precharging is finished, a very small current may flow when PC is changed to be high. SN1 has only a small capacitance and, hence, the voltage of SN1 may change significantly due to the above current. To avoid this, the gate voltage of MN1 is set to be VP2 lower than VP1 after D11 is precharged to VP1–Vth. Then, MN1 is turned off completely. In comparison with the first operation, no signal appears on SN1 unless the potential of D11 is extracted with a memory cell to VP2–Vth during the operation. However, the difference between VP1 and VP2 needs to be as small as about 0.1 to 0.2V. The time for extraction increases very little. Thus, a change in the voltage of D11 decreases and a change in the voltage of SN1 increases stably. Operation in other respects is the same as that of the first embodiment.

Figure 12:
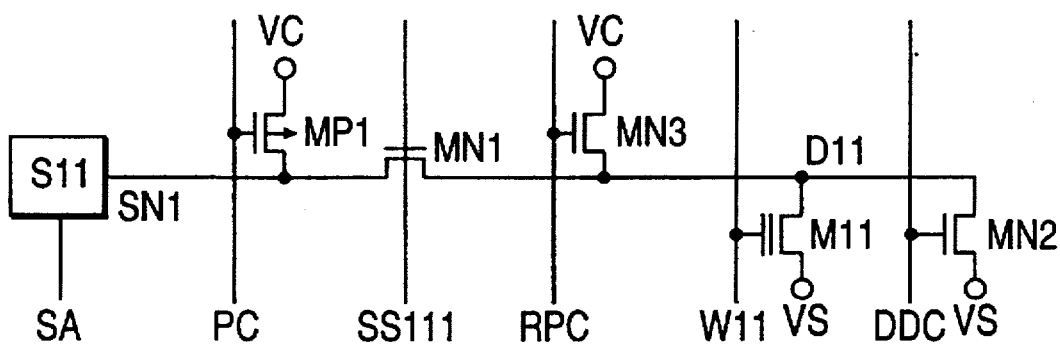
FIG. 12 is a diagram illustrating a fourth embodiment of the present invention which is an improvement from the system of the third embodiment.
Figure 13:
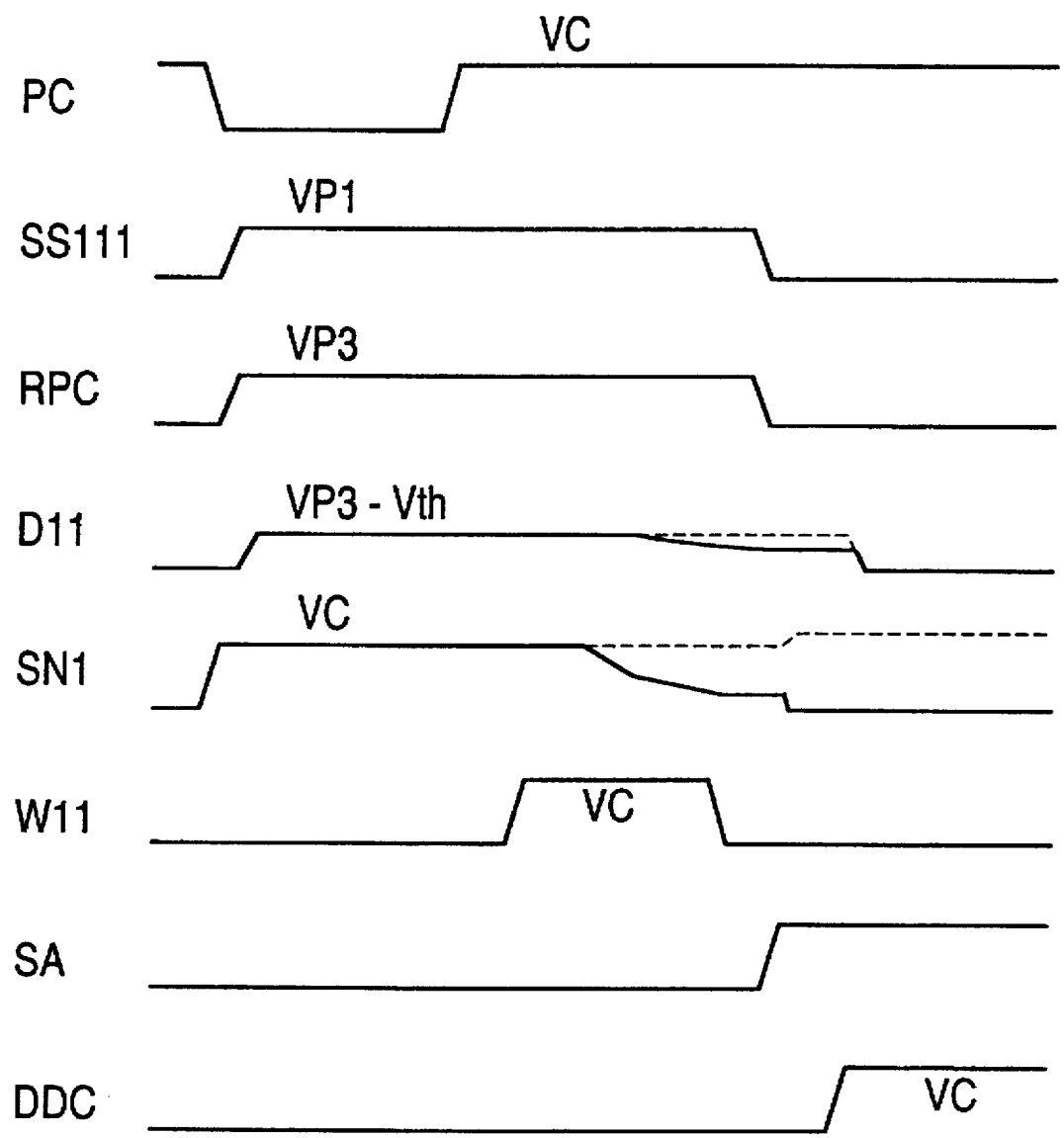
FIG. 13 shows voltage waves of FIG. 12.

FIG. 12 is a diagram illustrating a fourth embodiment of the present invention which is an improvement from the system of the third embodiment. In the second example of operation of the third embodiment, the gate voltage of MN1 was changed. In this embodiment MN3 is provided to precharge D11 to a potential higher than VP1–Vth. As shown in FIG. 13, the level of gate signal RPC of MN3 is set to be VP3, and D11 is precharged to VP3–Vth, where Vth is a threshold voltage of MN3. VP3–Vth may be set to be higher than VP1–Vth by 0.1 to 0.2V. Then, MN1 is completely turned off. No signal appears on SN1 unless the potential of D11 is extracted with a memory cell to VP1–Vth. The time for the extraction increases little. The operation in other respects is the same as the operation of the first embodiment.

Each of the third and fourth embodiments can be carried out in combination with the reading operation of the first embodiment and with the second embodiment. MP1 is connected to a node where the sense amplifier is connected to MS (corresponding to MN1) in the second embodiment, and the bit line is precharged to a voltage lower than the gate voltage of MS by Vth. MN3 is necessary for combining the operation of the fourth embodiment with the second embodiment. The gate voltage of ML should be always lower than the voltage of the bit line that is precharged when this combination is carried out since the output of the latch circuit in FIG. 5B can charge the bit line through ML when the operation of the second embodiment is carried out.

Figure 14:
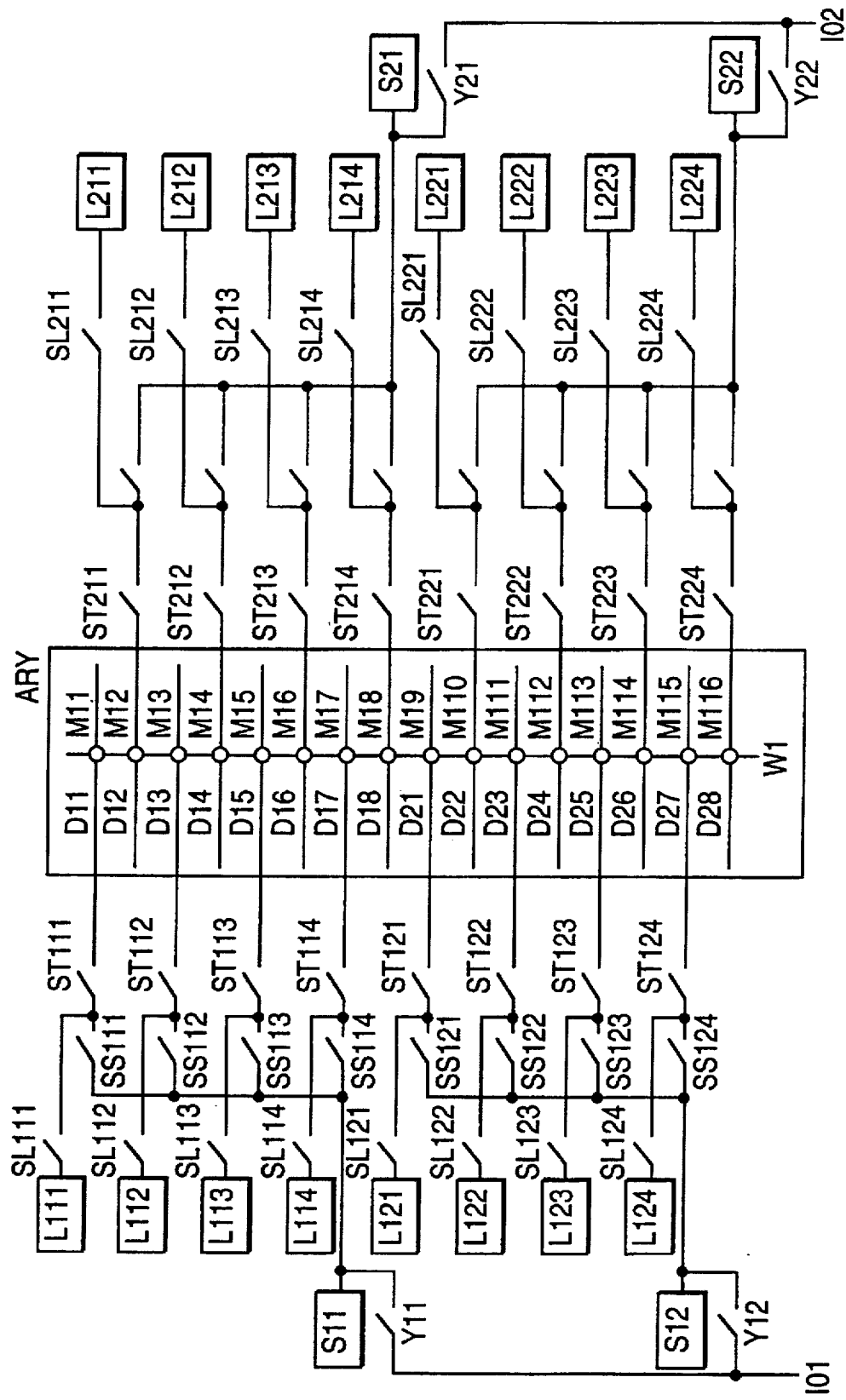
FIG. 14 is a diagram illustrating a fifth embodiment of the present invention.

FIG. 14 is a diagram illustrating a fifth embodiment of the present invention, which differs from the first embodiment in that it includes switches ST111 to ST224. This makes it possible to disconnect circuit portions of the sense amplifiers and latches from the large parasitic capacitances of the bit lines. This makes it possible to transfer the data only between the sense amplifiers and the latches. Advantageously, this decreases the consumption of electric power. An example for carrying out such an operation is shown in FIGS. 15A–D.

Figure 15A:
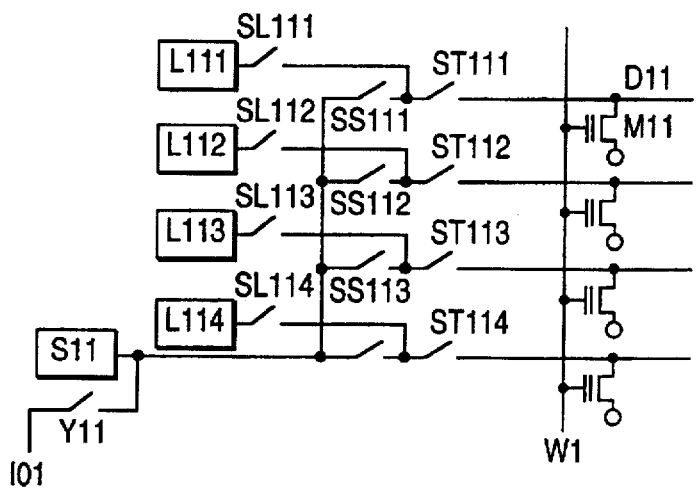
FIGS. 15A–D show an example of multi-value memory in which each cell stores a plurality of data.
Figure 15B:
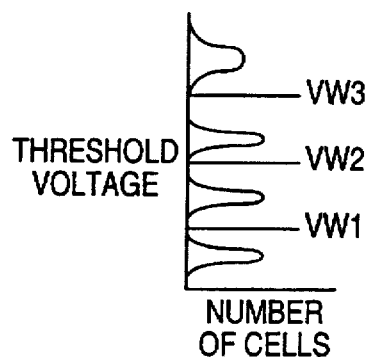

FIG. 15A shows an example of a multi-value memory in which each cell stores a plurality of data. In this figure, each cell stores 2-bit data. It is presumed that the memory cell has a distribution of threshold voltages as shown in FIG. 15B. Therefore, when the voltage of the word line is VW1, a memory cell having a distribution of the lowest threshold voltage is turned on. When the voltage is VW2, a memory cell having a distribution of either one of the lower two is turned on. When the voltage is VW3, a memory cell having any one of the lower three is turned on. To change the multi-value data stored in the memory cell back to binary data, data obtained by using VW1, VW2 and VW3 must be once amplified by the sense amplifier and stored somewhere and a simple logic operation must be carried out using the data. For example, when multi-value data in a memory cell M11 of FIG. 15A is read out, each data corresponding to one of VW1, VW2 and VW3 is amplified by S11 and data learned by VW1, VW2 and VW3 are distributed to the latches L111, L112 and L113. A connection between the bit line D11 and the sense amplifier is not necessary while the data is transferred to each of latches L111, L112 and L113. If the connection is kept on during the data transfer, the sense amplifier has to supply a current which is drained by the memory cell, i.e., the consumption of electric power increases. According to the fifth embodiment in such a case, the bit line is cut off to decrease the consumption of electric power.

Figure 15C:
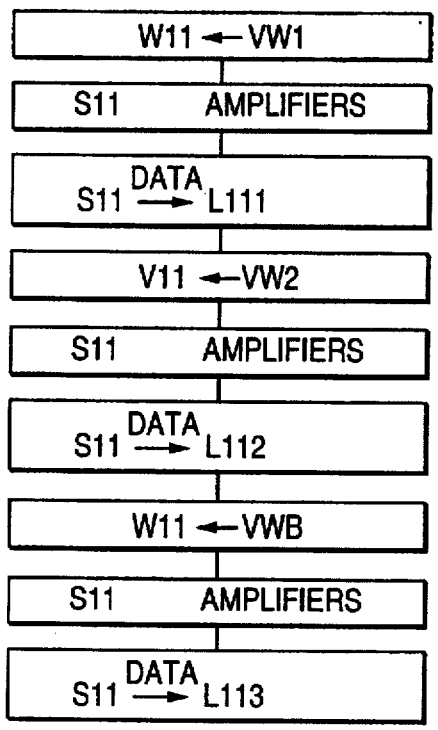
Figure 15D:
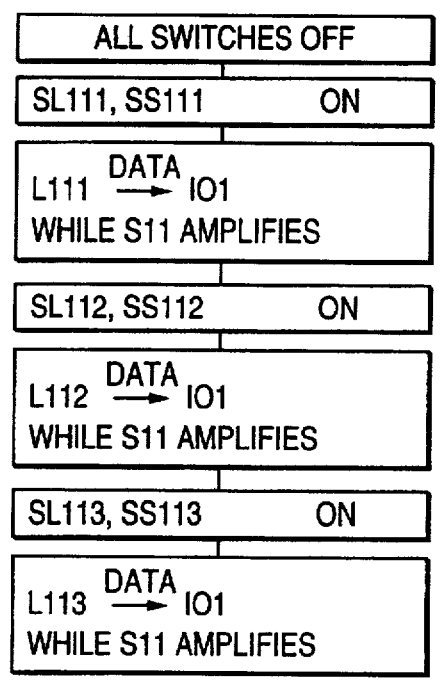

A specific concrete procedure for this operation is shown in FIG. 15C. The voltage of the word line W1 is set to be VW1. The data of M11 at this moment is amplified by the sense amplifier S11. Then, with ST111 to ST114 being turned off, SS111 and SL111 are turned on, and the data of S11 is transferred to L111. Then, SS111 and SL111 are turned off. Next, the voltage of the word line W1 is set to be VW2, and the data of M11 is amplified by S11. Then, with ST111 to ST114 being turned off, SS112 and SL112 are turned on, and the data of S11 is transferred to L112. Similarly, the data at the time when the voltage of the word line W1 is set to be VW3 is transferred to L113. The other memory cells are read out in the same manner. Since the sense amplifier S11 is shared by four memory cells, the fifth memory cell M19 (see FIG. 1) is read out simultaneously with M11. In other words, every four other memory cells connected to W1 are read out. Then, the data in the latches are transferred to the IO line IO1 through the sense amplifier. The procedure is shown in FIG. 15D. ST111 to ST114 are maintained turned off at all times. According to the fifth embodiment as described above, the data are transferred between the sense amplifier and the latches in a state where the capacitances of the bit lines are cut off.

Figures 16, 17:
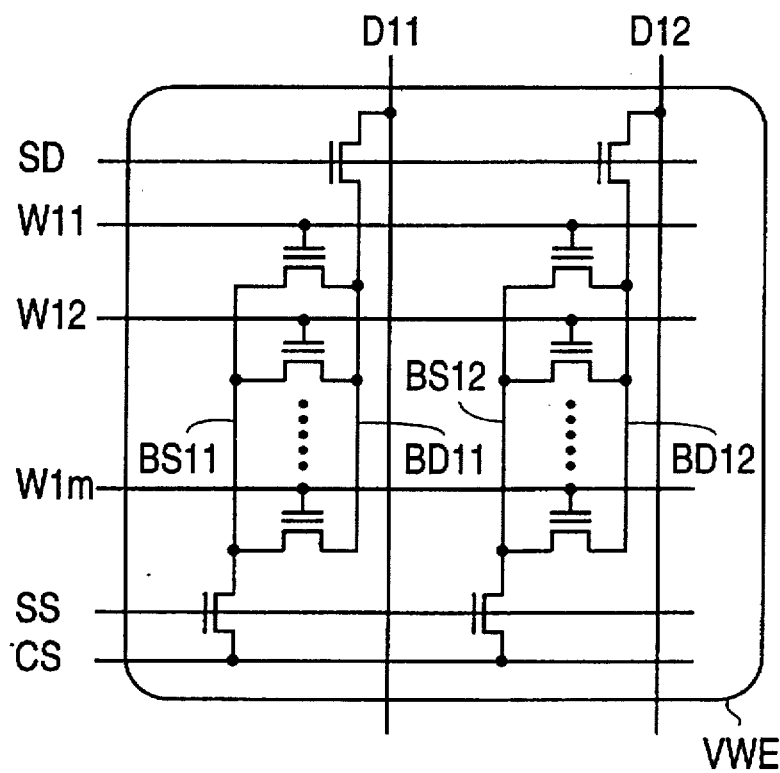
FIG. 16 shows a memory cell array to which the present invention is adapted.
FIG. 17 shows an example for applying voltages when the memory cell array of FIG. 16 is selected.

FIG. 16 shows a memory cell array to which the present invention is adapted. As shown, the memory cells connected with the word lines W11 to W1m have sources and drains as represented by BS11, BD11, BS12 and BD12. The connection is accomplished using a buried diffused layer wiring. The drains BD11 and BD12 are respectively connected to the bit lines D11 and D12 through switching MOS transistors controlled by SD. The sources BS11 and BS12 are connected to a common source line CS through switching MOS transistors controlled by SS. By turning the switching MOS transistors on by SD, the voltage of the bit line is applied to the memory cells during the writing operation. By turning the switching MOS transistors on by SD and SS, paths through which the currents of memory cells flow from the bit lines to the common source line are formed when a word line is selected. These elements are formed in wells in a semiconductor substrate. VWE denotes a terminal for applying a voltage to the wells.

FIG. 17 shows an example for applying voltages when the memory cell array of FIG. 16 is selected. To erase data, 12V is applied to the word line W11 and −4V is applied to the well voltage VWE. Due to a voltage difference between the word line and the well voltage, therefore, the electric charge moves between floating gates of the memory cells and the well, and the threshold voltage of the memory cells increase. The voltage −4V is applied to the common source line CS, too, so that the applied voltages become as diagrammed in FIG. 17. In the erasing operation in which −4V is applied to SD, the bit line voltage of 0V has nothing to do with the erasing in the drawing. To write data, 4V or 0V is applied to the bit line depending upon whether or not to write, and −9V is applied to the word line. In the writing operation, a large amount of electric charge moves at the voltage difference when 4V is applied to the drain of the memory cell connected to the bit line and −9V applied to the word line. When the drain is 0V, however, the voltage difference is so small that the electric charge moves very little. In this operation, the voltage of SD is set to be 7V to turn on the MOS transistor completely so that the voltage of the bit line is applied to the memory cell. In this case, the source BS11 of the memory cell is floated as designated at F.

High absolute voltages such as −9V and 12V are applied to a flash memory as shown in FIG. 17 and, hence, MOS transistor must be designed to have a large breakdown voltage.

Figure 18:
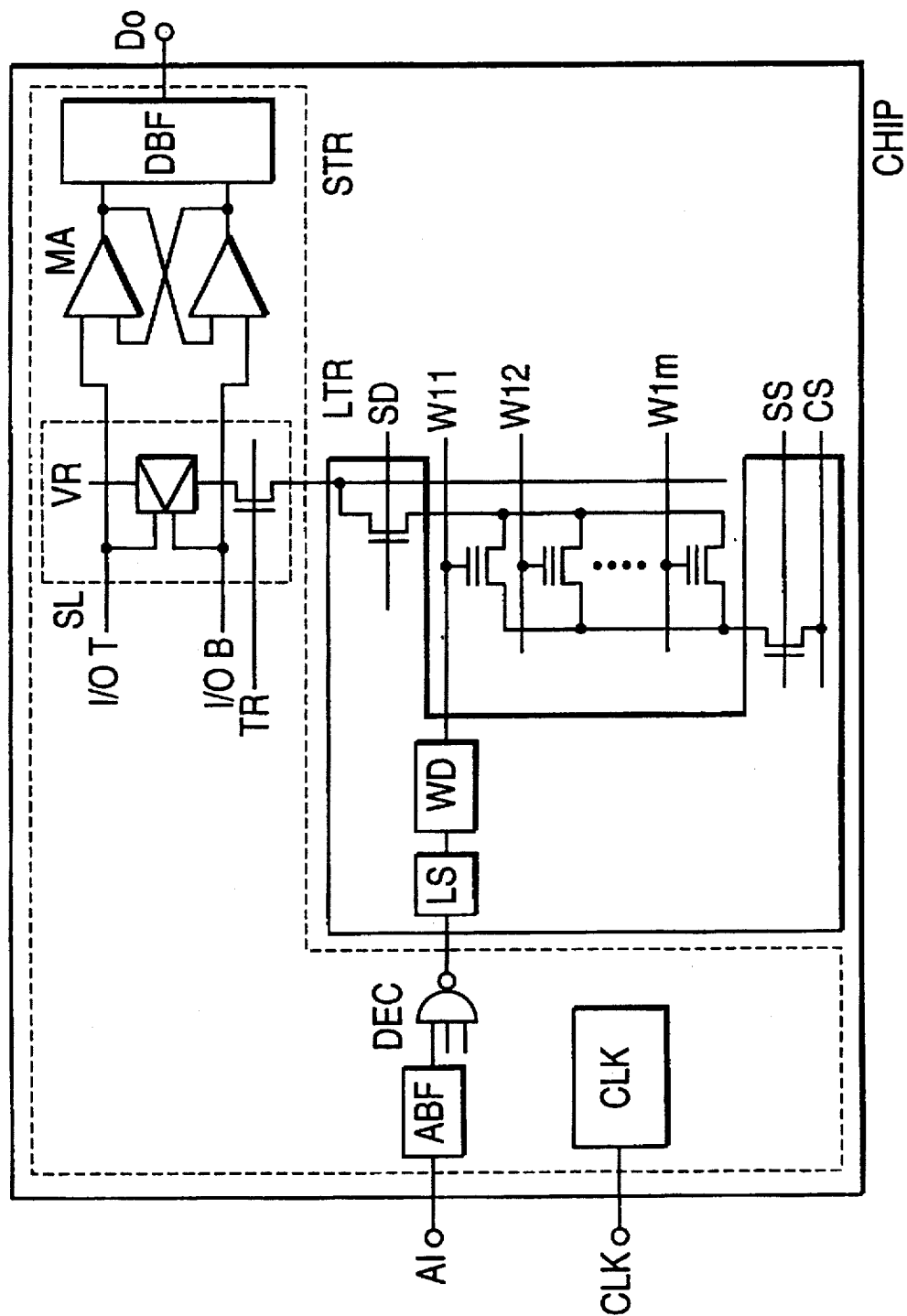
FIG. 18 shows an example of a chip using oxide films of different thicknesses for MOS transistors.

FIG. 18 shows an example of a chip using oxide films of different thicknesses for MOS transistors. If the MOS transistor has an oxide film that is thick enough for a high voltage such as 12V, the clock system and main amplifier become slow in operation when an external source voltage is, for example, 2 volts. From the standpoint of properties of the currently available tunnel oxide film, it is difficult to lower the high absolute voltages to meet the power source voltage. It is therefore desired to prepare two kinds of oxide films for the peripheral circuits in addition to that of the memory cells, and to use them at desired places. Even in a flash memory chip, however, different voltages are used such as 4V and 7V, as described in this specification. The thick oxide film may be designed to meet the highest voltage in the chip, however, the problem is what voltage the thin oxide film should be adapted to. In FIG. 18, the thick film is used for transfer MOS transistors whose gates are connected to SD or SS, a word driver WD and level shift circuit LS in a large thickness oxide film region LTFR. The thin film is used for the sense amplifier, a main amplifier MA, a data buffer, a transfer MOS transistor whose gate is connected to TR, an address buffer ABF, a decoder and a clock circuit CLK in a small thickness oxide film region STFR. In this embodiment, the sense amplifier produces 4V. To transmit this voltage to the bit line, TR must be about 7V. The thickness of the oxide film which is enough to tolerate 7V is a minimum thickness in STFR. This voltage 7V makes a boundary between the thin-film system STFR and the thick-film system LTFR. The sense amplifier operating on 4V can be formed using a thick film in LTFR. In this case, the thin-film system STFR covers only those portions that operate on an external power source voltage 5V. Therefore, the thickness can be further decreased than when the boundary is set at 7V. Though not shown in FIG. 18, an internal voltage-generating circuit may be formed in the semiconductor substrate. Whether the region of the internal voltage-generating circuit is LTFR or STFR depends on a voltage that makes a boundary.

Figure 19:
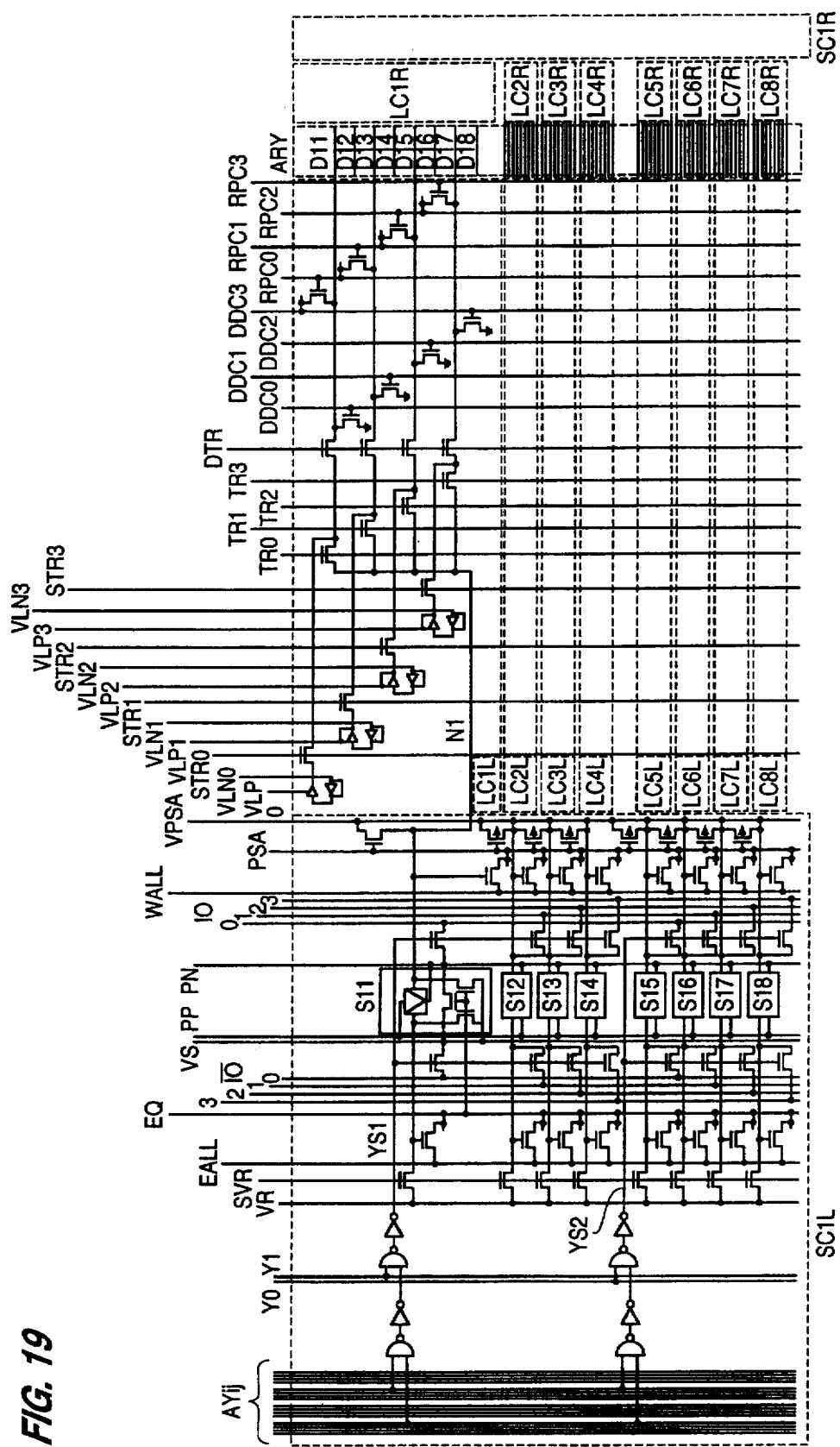
FIG. 19 shows a concrete circuit constitution as a sixth embodiment of the present invention.

FIG. 19 shows a concrete circuit constitution as a sixth embodiment of the present invention. There are LC1L to LC8L and LC1R to LC8R, each including latches and switches sharing the sense amplifiers, and SC1L and SC1R, each including sense amplifiers and decoding circuits of the Y-system. The memory cell array ARY is between LC1L to LC8L and LC1R to LC8R, and between SC1L and SC1R. MOS transistors controlled by RPC0 to RPC3 are those for precharging the bit lines, and the gates of the MOS transistors have a large length to precisely precharge the bit lines. MOS transistors controlled by DDC0 to DDC3 are those for discharging the bit lines. MOS transistors controlled by DTR are those for cutting the bit lines off from the latches and the sense amplifiers. MOS transistors controlled by TR0 to TR3 are the switching MOS transistors for sharing the sense amplifier, and have long gates when they are used for precharging the bit lines, as explained for the third and fourth embodiments. STR0 to STR3 are MOS transistors for connecting the latches to the bit lines. VLN0, VLP0 to VLN3 and VLP3 are power source terminals of the latches. The latches have short gate transistors. The bit lines D11, D13, D15 and D17 are grouped into N1 by the switching MOS transistors controlled by TR0 to TR3, and share the sense amplifier S11. From the standpoint of layout, the wiring N1 traverses the latches and therefore should be formed by a metal wiring layer over the latches. When three metallic layers are used, for example, a first layer is for the circuit of the latches, a second layer is for the power source of the latches, and a third layer is for laying out the wiring N1. In the foregoing description, a component LC1L was mentioned. The same holds true for LC2L to LC8L and LC1R to LC8R.

Next, in the SC11, each of the MOS transistors controlled by PSA is used for precharging the bit lines in the system explained in the third and fourth embodiment, and the power source thereof is VSA. S11 to S18 are circuits each including a sense amplifier and equalizing MOS transistors, and EQ denotes an equalize start signal. Data are transferred between the sense amplifiers and the IO lines IO0 to IO3 by MOS transistors controlled by YS1 and YS2. VR is a reference voltage of the sense amplifiers and is applied to the sense amplifiers through MOS transistors controlled by SVR. When the outputs of the sense amplifiers become all 1 or 0, either group of MOS transistors whose drains are connected to EALL or WALL are all turned off. This makes it possible to determine whether all the memory cells have reached a desired threshold voltage or not at the time of writing or erasing. As explained in the second embodiment, for instance, when the memory cell assumes a predetermined threshold voltage after the verification, the sense amplifier produces 0V on the side of the bit lines, and no current flows into WALL. Upon detecting this fact, it is possible to learn at one time that the writing operation is finished. YS1 and YS2 decode the predecoding signals AYij, Y0 and Y1 in the logic circuit in the SC1L. In the foregoing were described the components in the SC1L. SC1R, too, is constituted by similar components.

The operation of the sixth embodiment will be described with reference to FIGS. 20 to 22. In the following description, small letters i and j represent numerals, i.e., 0, 1, such as of TR0 to TR3.

Figure 20:
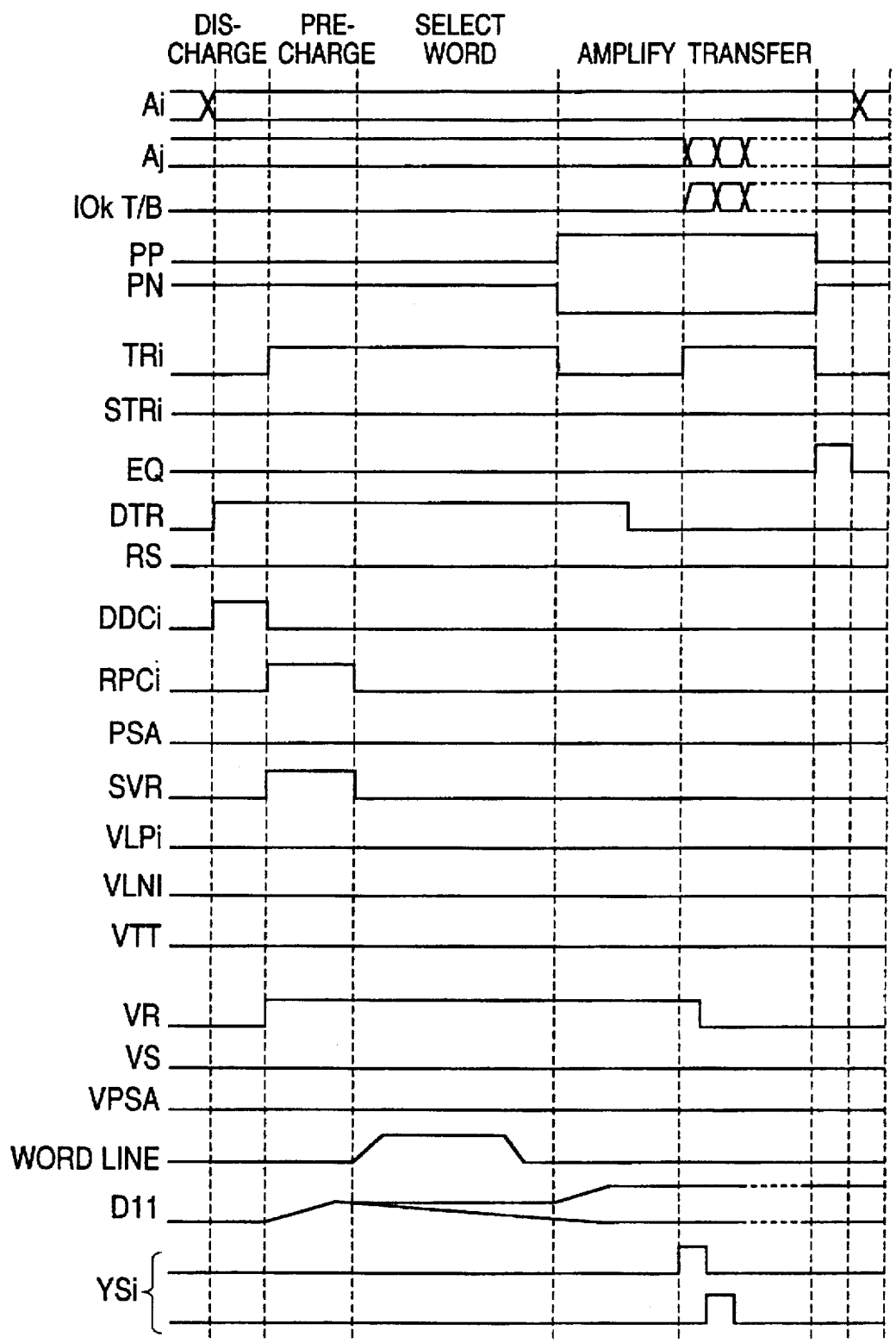
FIG. 20 is a diagram illustrating a read operation of the sixth embodiment.

FIG. 20 is a diagram illustrating a read operation of the sixth embodiment. This is an example of amplifying the result of a precharged bit line being discharged by a selected memory cell. The operation is divided into phases of discharging a bit line, precharging the bit line, selecting a word line, amplifying data from the selected memory cell and transferring the data. First, an address Ai is changed to select a desired word line. DDCi is set to a high level in a state where DTR is set to a high level, and then a bit line is discharged. Next, TRi and SVR are set to the high level, and an input node of the sense amplifier and the bit line are precharged to a level lower than the signal level of RPCi by Vth, and another input of the sense amplifier is set to the voltage VR. Then, a word line is selected. Thus, the bit line is discharged in proportion to the data in a memory cell. After the word line is unselected, TRi is set to the low level and the bit line is disconnected from the sense amplifier.

Then, sense amplifier start signals PP and PN are changed to let the sense amplifier amplify a voltage difference between the bit line voltage and VR. Thereafter, YS1 and YS2 are changed to output the data of the sense amplifier onto the IO line. Concerning this operation, the drawing of the sixth embodiment shows only two YSi's. In practice, the operation is repeated a required number of times. Thereafter, the sense amplifier is turned off and a voltage at both input nodes is equalized by EQ. Thus, the reading operation is carried out while using FIG. 6.

Figure 21:
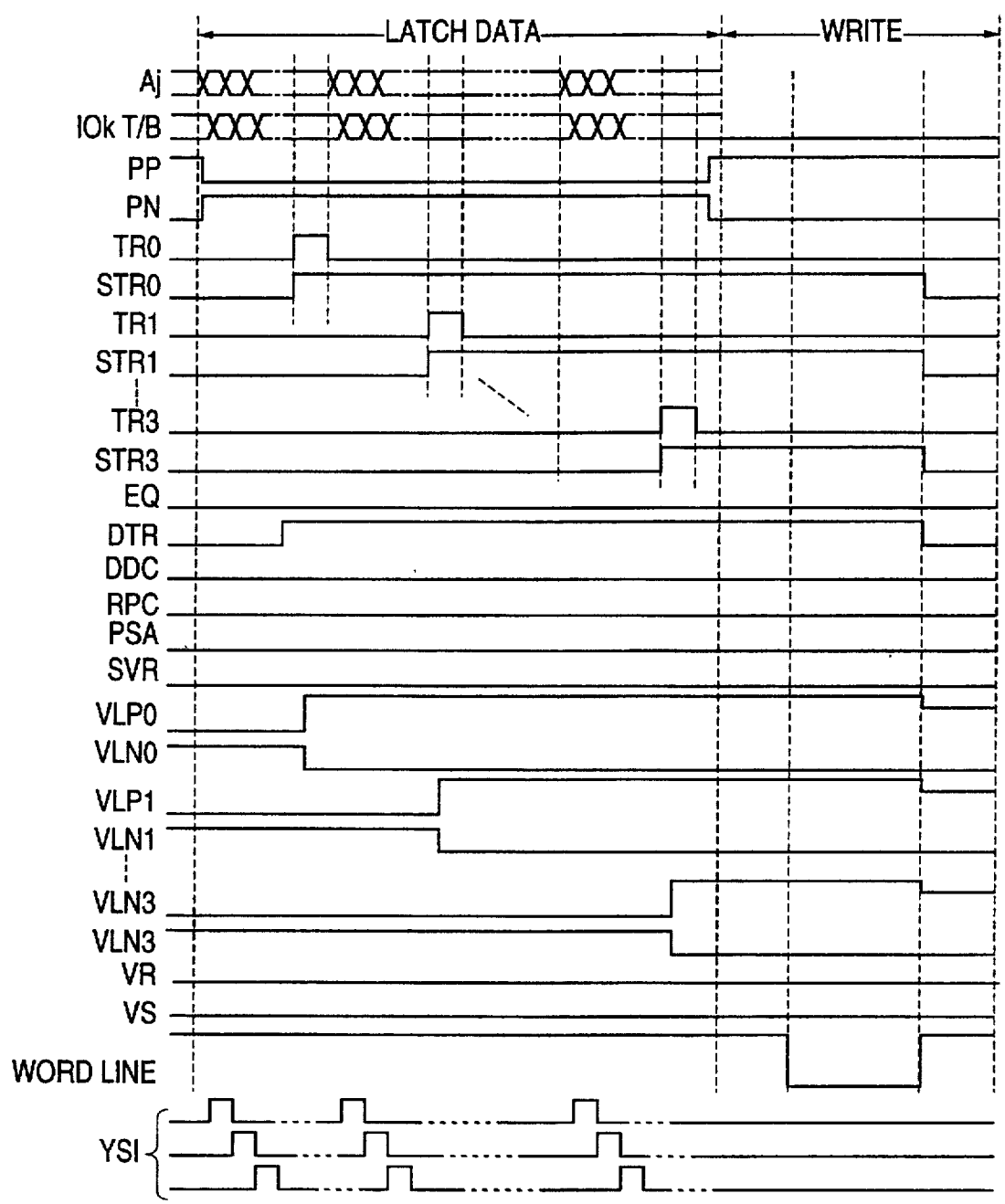
FIG. 21 is a diagram illustrating a latching of data for writing and write operation in the sixth embodiment.

FIG. 21 is a diagram illustrating a latching of data for writing and the write operation in the sixth embodiment. The data latching operation is repeated a number of times equal to the number of the bit lines sharing a sense amplifier. In this operation, data are stored in all of the sense amplifiers from the IO lines as addresses change and the data are transferred at one time to latches. Other data are stored to the other latches respectively by the repetition of the data latching operation. Thus, the data to be written into memory cells are stored in all of the latches. Thereafter, a voltage corresponding to the data is applied to the memory cells to write the data utilizing a voltage difference from that of the word line. Concretely speaking, necessary data is, first, fed to an IO line and is written into a sense amplifier by selecting YSi. YSi are closed and next data is sent onto the IO line. The address is changed to select the next YSi, and the next data is written into next sense amplifier. This operation is repeated a number of times equal to the number of the sense amplifiers. After the data are stored in all of the sense amplifiers, TR0 and STR0 are selected, VLP0 and VLN0 are switched, and the data of the sense amplifiers are transferred to latches. At this moment, voltages appear even on corresponding bit lines. This can be directly used as voltages at the time of writing. After the transfer of data is finished, only TR0 is placed in a non-selected state, and the sense amplifiers are disconnected from the bit lines. Then, again, data are written into the sense amplifiers through the IO lines while the addresses changes. After the data are written into all of the sense amplifiers, the data of the sense amplifiers are transferred to other latches in the same manner as the previous time. This time, TR1 and STR1 are selected, and VLP1 and VLN1 are changed over to transfer the data of the sense amplifiers to the latches. Upon repeating this operation four times in the sixth embodiment, the data are stored in all of the latches. The operation then proceeds to writing the data. Since STRi have been selected already, voltages from the latches appear on the bit lines. These voltages may be used directly or may be amplified as required. To amplify the voltages, voltage boost circuits are provided to the latches which are applied with signals VLN0, VLP0 to VLN3 and VLP3. Then, −9V is applied to the word line and switches connecting the memory cell to the bit line are selected to start writing the data. When the writing is finished, the word line and STRi are placed in the non-selected state.

Figure 22:
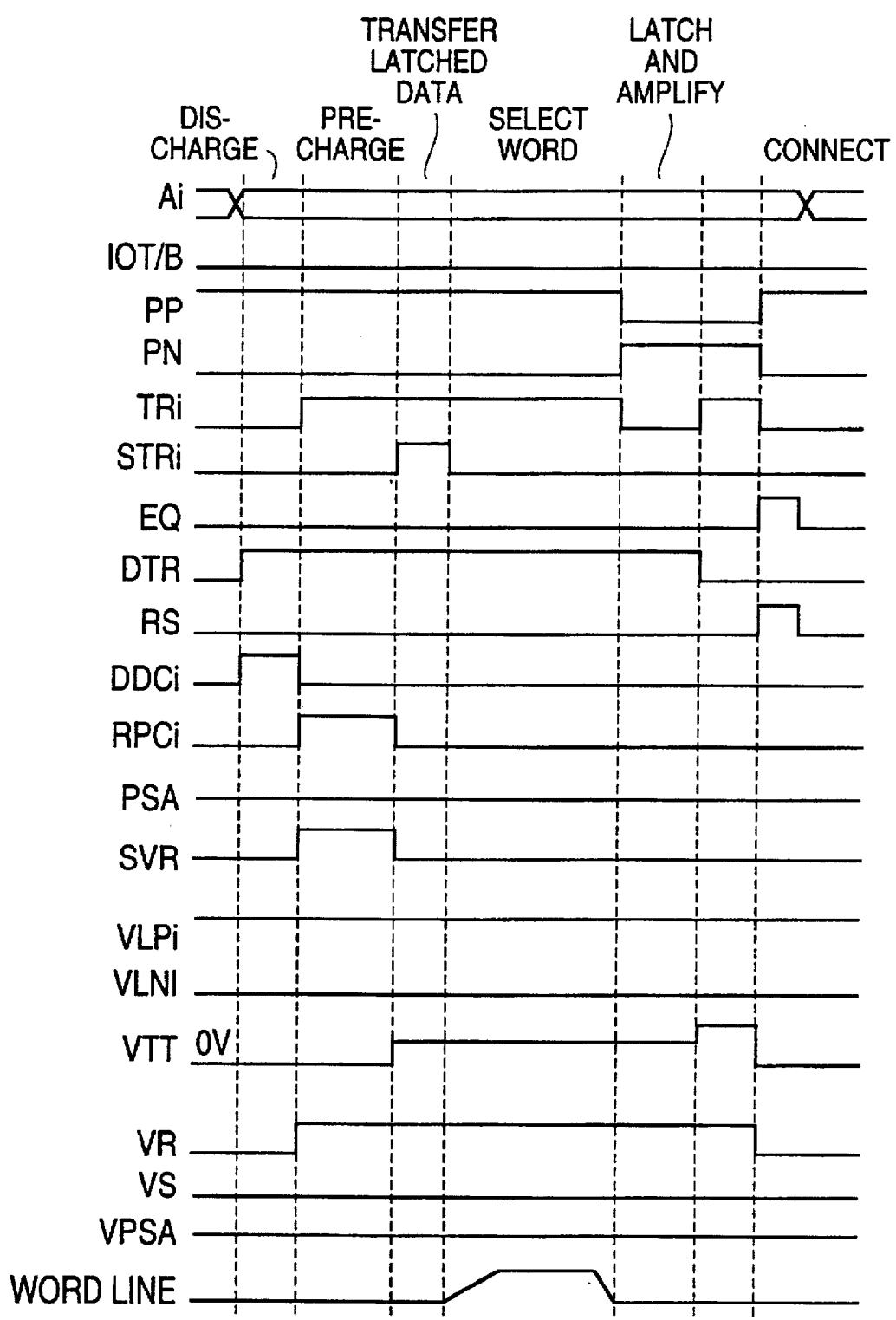
FIG. 22 is a diagram illustrating a verification operation of the sixth embodiment.

FIG. 22 is a diagram illustrating a verification operation of the sixth embodiment. This operation is carried out following the above operation of FIG. 21.

First, DDCi is selected to discharge a data line. Thereafter, TRi and SVR are set to the high level, and an input node of a sense amplifier and a bit line are precharged to a level lower than the signal level of RPCi by Vth, and another input node of the sense amplifier is set to the voltage VR. After the precharging is finished, SVR and RPCi are placed in the non-selected state. In this state, STRi is selected and is set to be about 1V. Then, as explained in the second embodiment, the bit line is discharged depending upon the state of the latch. Thereafter, the word line is selected and the state of the memory cell is read onto the bit line. After the word line is selected for a predetermined period of time, PP and PN are changed over to amplify the signal on the bit line. The data of the sense amplifier is then written into the latch. This operation is performed for all of the bit lines sharing the sense amplifier. Thus, a signal that varies depending upon whether the data is being written or not appears on the bit line as explained in the second embodiment. Then, the data is written as shown in the latter half of the explanation of FIG. 21, and verification and writing are repeated until all of the memory cells are set to desired threshold voltage.

Figure 23:
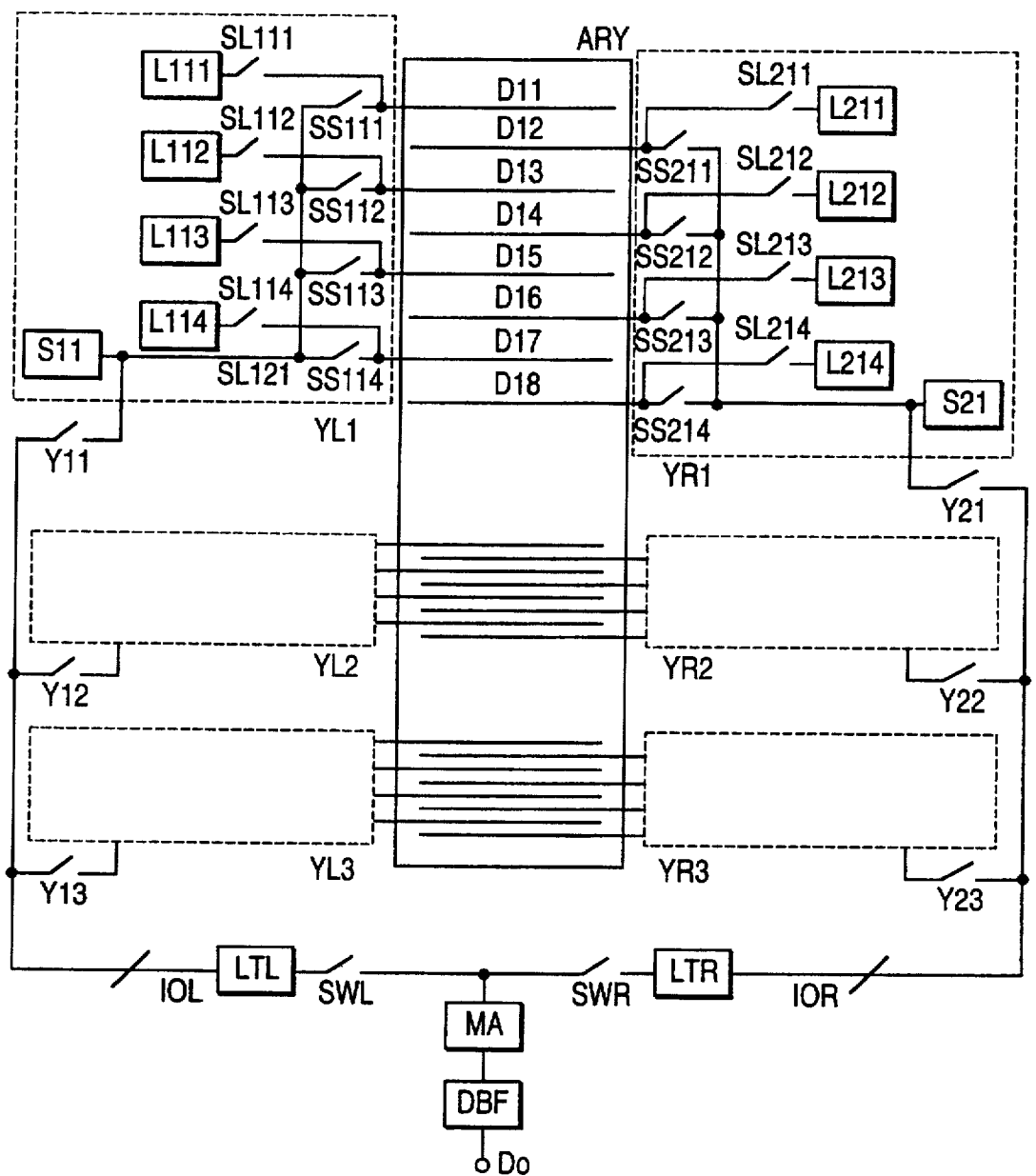
FIG. 23 shows a system for transferring the contents of the sense amplifiers of a seventh embodiment.

FIG. 23 is a diagram illustrating a seventh embodiment of the present invention and shows a system for transferring the contents of the sense amplifiers on both sides of the memory cell array to the main amplifier at high speed by interleaving the contents. The main amplifier MA and the output buffer DBF are shared by right and left IO lines IOR and IOL (having True and Bar, respectively, to which complimentary signals are transferred). Switches SWL and SWR are provided between MA and the IO lines respectively. MA amplifies data by switching SWL and SWR alternatingly. LTR and LTL are latch circuits for a pipeline operation. Each of LTR and LTL holds IO data while the other latch circuit transfers data to MA. In this system, a frequency of an output Do of the output buffer DBF is twice as high as that of each IO line. This makes it possible to read the data at high speeds. The circuitry between the main amplifier and Do can be laid out as a unitary structure at a predetermined place of the chip to carry out the operation at high speeds. The IO lines are operated at a low speed since they run over the big memory cell array. The above-mentioned operation makes it possible to accomplish high-speed operation. LTR and LTL may be omitted.

Figure 24:
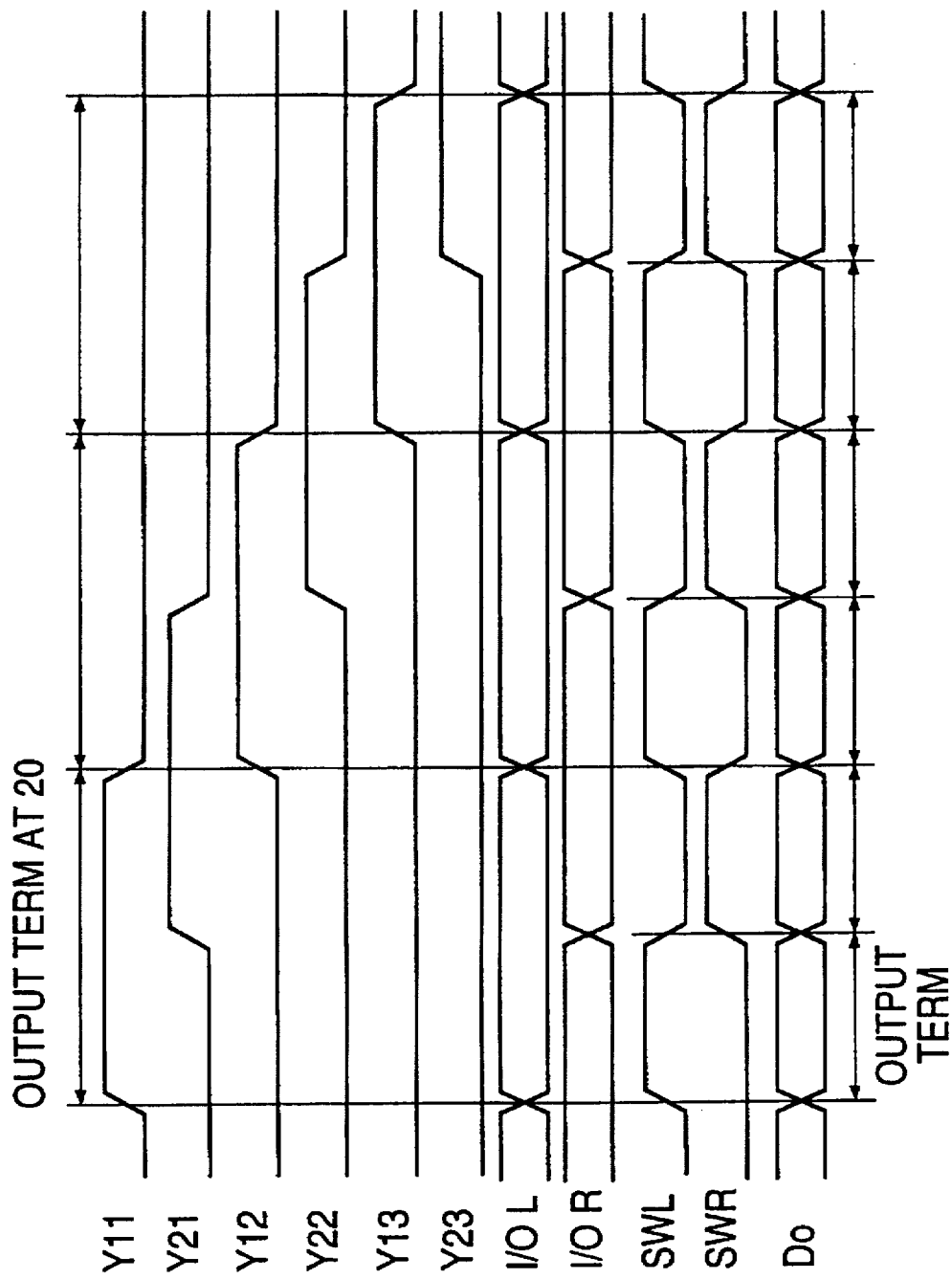
FIG. 24 shows voltage waves of the seventh embodiment.

The operation is described with reference to FIG. 24. The description starts with a state where a word line is selected and data of memory cells are amplified by sense amplifiers. First, Y11 is selected. Accordingly, the data of the sense amplifier S11 is transferred to IOL. Next, Y21 is selected and the data of the sense amplifier S21 is transferred to IOR. In parallel with this operation of transferring the data of S21, the data of IOL is sent to the main amplifier MA by selecting SWL. Thus, the data of S11 is output to the output Do. While this output operation is being carried out, the data of IOR has been completely transferred from the sense amplifier. Then SWR is selected. The data of IOR is sent to the main amplifier MA and is output to the output Do. YS12 is selected in parallel with the output data of IOR. Thus, the data of the sense amplifier S12 is transferred to IOL. YS22 is selected while sending the above data to the main amplifier by selecting SWL. This makes it possible to read the data at a high speed which is twice as fast as the operation of the IO lines. This system can be used even for the operation for sending the data to the sense amplifiers in the writing operation.

Figure 25:
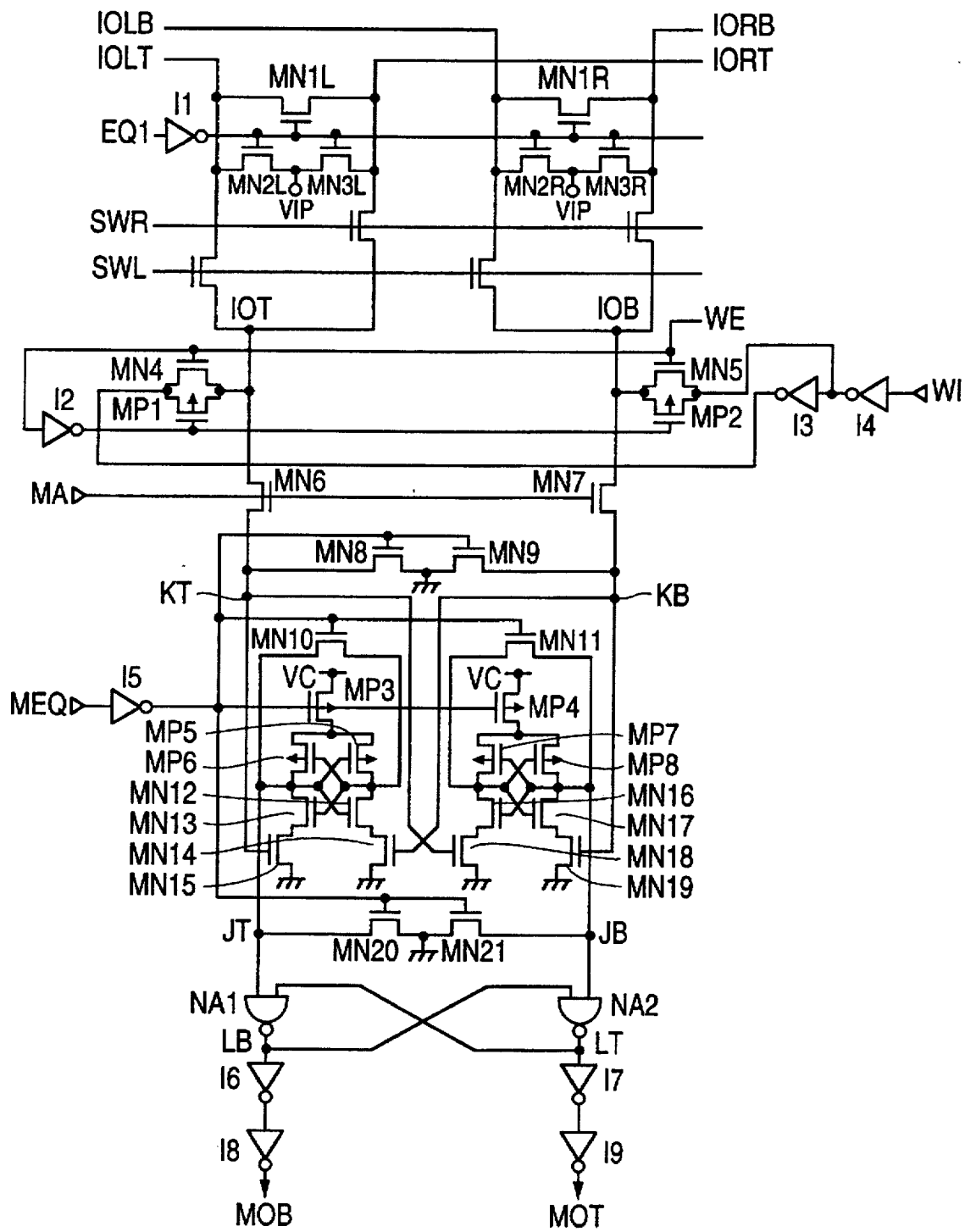
FIG. 25 is a diagram illustrating a main amplifier that is used for the present invention.

FIG. 25 is a diagram illustrating a main amplifier that is used for the present invention. The MOS transistors that receive signals SWL and SWR at the gates thereof correspond to the switches of FIG. 23. MN1L to MN3L and MN1R to MN3R are MOS transistors for equalizing IO lines. In response to a signal EQ1, the IO lines are equalized to the voltage VIP. WI is a signal of write data from a data input terminal of a chip that is not shown in FIG. 23, and represents 1 or 0 depending upon whether it has the high level or the low level. WE is a signal that indicates whether to send the signal WI to the IO line or not. MN6 and MN7 controlled by MA are switching MOS transistors for connecting the bit line to the main amplifier. These switches may be included into MOS transistors that are controlled by SWL and SWR. KT and KR are input terminals of differential amplifiers. Each of the differential amplifiers is an nMOS transistor differential amplifier having a load of a flip-flop type. A differential signal is input to the gates of MN14, MN15, MN18 and MN19. MP3 and MP4 are current sources for the differential amplifiers and are controlled by MEQ. MN8 to MN11 are MOS transistors for equalizing the inputs of the differential amplifiers and are controlled by MEQ. Each of the differential amplifiers has a load that is constituted by CMOS transistors of the flip-flop type, and excellently operates on a low voltage. JT and JB are outputs of the differential amplifiers, and are shaped by NA1 and NA2 that constitute the latch. Their driving power is then enhanced through an inverter to form MOT and MOB which are connected to an output buffer DBF (see FIG. 23).

Figure 26:
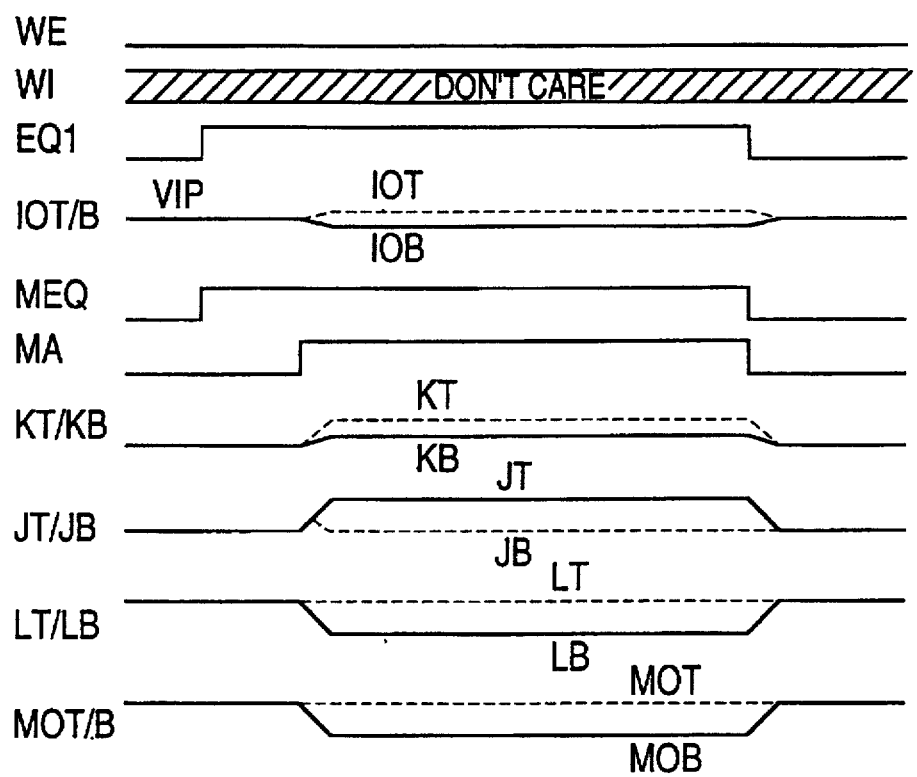
FIG. 26 shows a read operation of the main amplifier.

FIG. 26 shows a read operation of the main amplifier. First, EQ1 changes from the low level into the high level, thus an equalize operation of the IO lines ends. Then, a signal of the sense amplifier in the memory cell array appears on the IO lines. Then, MEQ changes to end an equalize operation of the main amplifier and turn on the current source of the main amplifier. MA turns on MN6 and MN7. Thus, the signal appears on KT/KB that had been equalized to 0V, and is input to the main amplifier. The main amplifier operates to amplify the signal and output nearly full amplitude signals on JT/JB which are the outputs thereof. LT/LB are outputs of the latches NA1 and NA2. The signals appear on MOT/MOB and are input to the output buffer of the next stage. As EQ1, MA and MEQ change, the main amplifier is inactivated, and the outputs MOT/MOB are at the high level.

Figure 27:
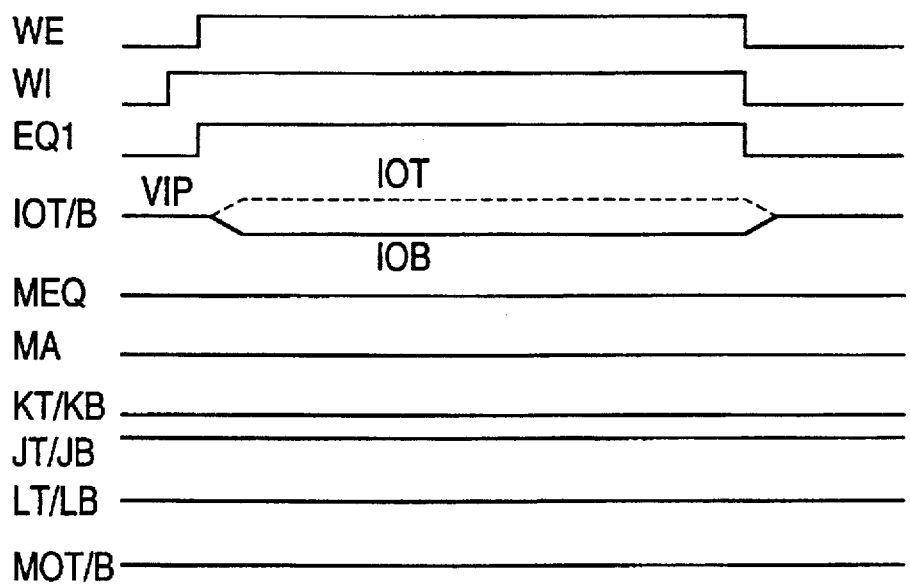
FIG. 27 shows a write operation of the main amplifier.

FIG. 27 shows a write operation of the main amplifier. In this case, the differential amplifiers do not operate. First, a signal corresponding to the input data of the chip appears on WI. The data is transferred by WE to the IO lines which is no longer equalized as a result of changing EQ1. When WI changes in this state, the data on the IO lines change too. After a signal YS is decoded, the data is stored in a sense amplifier through the IO lines. After a series of operations are finished, WE is changed so that the IO lines are disconnected from the signal WI.

The present invention uses a signal of a voltage higher than the external power source voltage of 5V. In the writing operation, for example, a voltage of 3 to 4V is applied to the drain of the memory cells. To transfer this voltage from the latch to the bit line, a gate voltage of about 7V needs to be applied to an MOS transistor. To generate a signal such as of 7V, the control circuit itself is operated by the external power source requiring level conversion.

Figure 28:
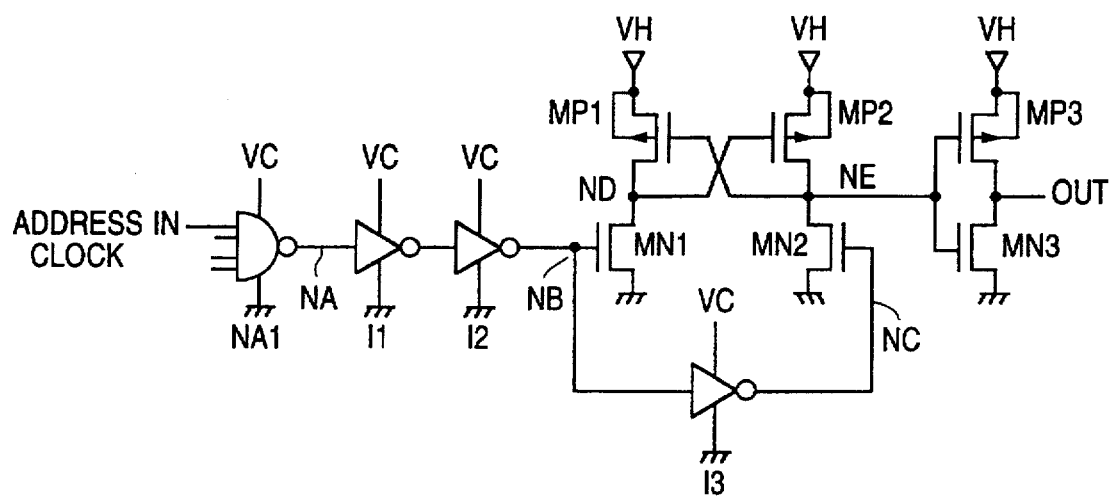
FIG. 28 shows a level conversion circuit.
Figure 29:
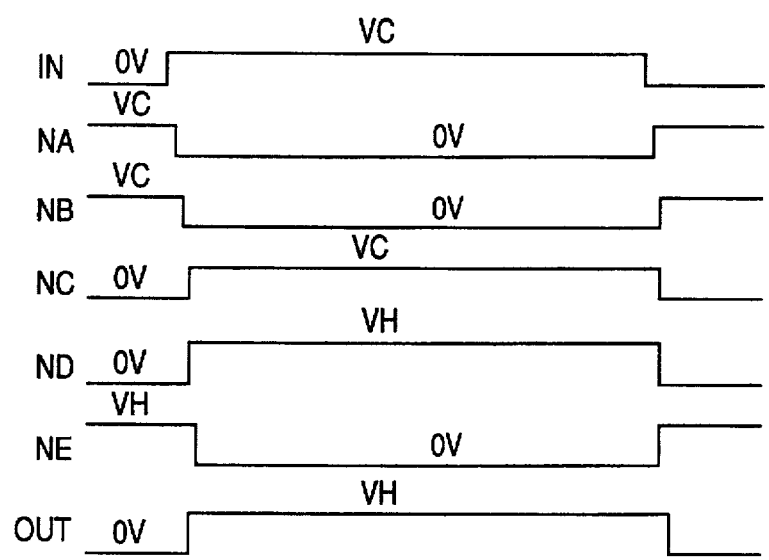
FIG. 29 is a diagram illustrating an operation of the level conversion circuit.
Figure 30:
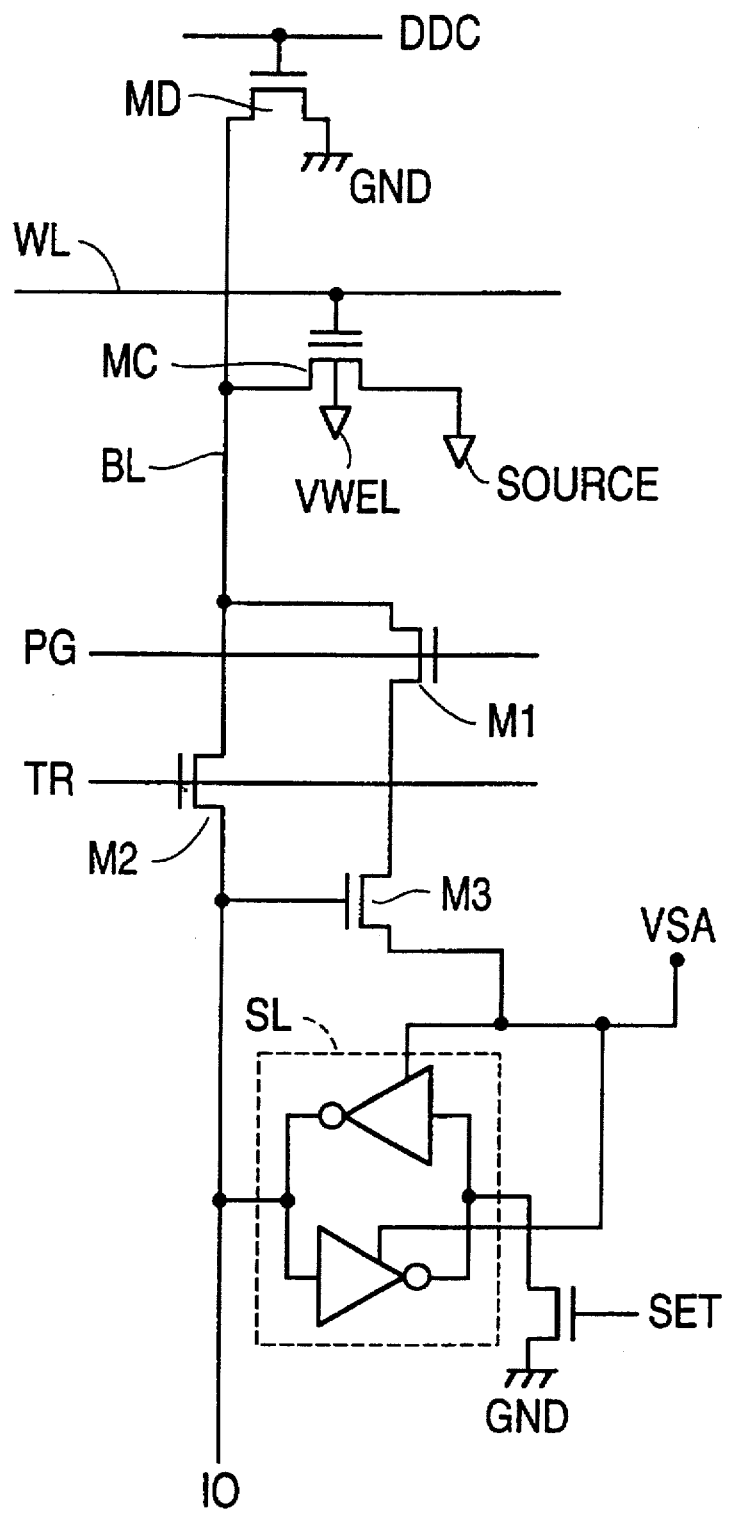
FIG. 30 shows a conventional circuit.

FIG. 28 shows a level conversion circuit wherein VC denotes an external power source voltage and VH denotes a high voltage. A logic operation is represented by NA1. After having passed through inverters, these voltages are input to a level conversion circuit constituted by MP1, MP2, MN1, MN2 and inverter I3. In this circuit, the inversion signal under VC is input to NB and NC which are the gates of MN1 and MN2. Therefore, either one of MN1 or MN2 is completely turned off and the other one is turned on. On the VH side, MP1 and MP2 are connected with their gates and drains crossing each other. MP3 and MN3 are output drivers. The operation of this circuit will now be described with reference to FIG. 29. Here, it is presumed that the output NA of NA1 are low when IN is high. When NA goes low, NB becomes low and thus NC becomes high or inverted. Therefore, MN1 is turned off and MN2 is turned on. Since MN2 is turned on, NE goes low, whereby MP1 is turned on.

Then, since MN1 is off, ND assumes the level VH. Accordingly, MP2 is turned off and NE completely reaches the low level due to MN2. Hence, VH appears on ND, 0V appears on NE, and the VC drive system is converted into the VH drive system. Upon receiving this output, the inverter constituted of MP3 and MN3 drives the output OUT. Since NE is 0V, OUT becomes VH. When IN changes from the high level into the low level, the relationship is simply inverted. Similarly, therefore, the VC drive system is converted into the VH drive system, NE turns into VH, and OUT assumes 0V. This level conversion circuit makes it possible to generate a signal required for the present invention.

Since each of the sense amplifiers is shared by a plurality of bit lines using switches, the pitch of the sense amplifiers becomes of the pitch which is a multiple of the bit line pitch. This means it is easy to layout the sense amplifiers. Moreover, since the sense amplifiers and the latches are separately provided, it is allowed to independently design the sense amplifiers to mainly perform the analog operation and the latches to mainly perform the digital operation. Due to the sensing operation for precharging the bit line to a voltage lower than the gate voltage of MOS transistor inserted between the bit line and the sense amplifier by the threshold voltage thereof, there is no need of complete discharge of the bit line having a large parasitic capacitance, and the operation is accomplished at a high speed, thereby maintaining stability.

While the present invention has been described in detail and pictorially in the accompanying drawings it is not limited to such details since many changes and modifications recognizable to those of ordinary skill in the art may be made to the invention without departing from the spirit and the scope thereof.

What is claimed is:

1. A nonvolatile semiconductor memory device having a word line, a plurality of bit lines crossing said word line, and a plurality of memory cells including MOS transistors whose control gates are coupled to said word line and whose drains are coupled to said bit lines respectively, each of the MOS transistors having a floating gate, said non-volatile semiconductor memory device comprising:

latch circuits coupled to said plurality of bit lines, respectively;

a plurality of first switches coupled between said plurality of bit lines and said latch circuits, respectively;

a sense amplifier coupled to said plurality of bit lines in common; and a plurality of second switches coupled to said plurality of bit lines respectively, said switches being disposed between said plurality of bit lines and said sense amplifier, wherein each of said plurality of first switches includes a transistor having a conduction path between a corresponding one of said plurality of bit lines and a corresponding one of said latch circuits, respectively, and wherein, when data is to be read from a memory cell selected out of said plurality of memory cells, said plurality of first switches are turned off and one of said plurality of second switches between said selected memory cell and said sense amplifier is turned on.

2. A nonvolatile semiconductor memory device according to claim 1, wherein said transistor in each of said plurality of switches is an MOS transistor.

3. A nonvolatile semiconductor memory device according to claim 2, wherein, when data in said latch circuits are written into said plurality of memory cells, said second switches are turned off and said plurality of first switches are turned on.

4. A nonvolatile semiconductor memory device according to claim 2, wherein a MOS transistor of said latch circuit has a gate length shorter than a gate length of a MOS transistor of said sense amplifier.

5. A nonvolatile semiconductor memory device according to claim 3, wherein a MOS transistor of said latch circuit has a gate length shorter than a gate length of a MOS transistor of said sense amplifier.

6. A nonvolatile semiconductor memory device having a word line, a plurality of bit lines crossing said word line, and a plurality of memory cells including MOS transistors whose control gates are coupled to said word line and whose drains are coupled to said plurality of bit lines respectively, each of the MOS transistors having a floating gate, said non-volatile semiconductor memory device comprising:

first latch circuits coupled to odd ones of said bit lines, respectively;

a first sense amplifier coupled to said odd ones of said bit lines in common;

a plurality of first switches coupled between said odd ones of said bit lines and said first sense amplifier, respectively;

second latch circuits coupled to even ones of said bit lines, respectively;

a second sense amplifier coupled to said even ones of said bit lines in common; and a plurality of second switches coupled between said even ones of said bit lines and said second sense amplifier, respectively.

7. A nonvolatile semiconductor memory device according to claim 6, further comprising:

a plurality of third switches coupled between said odd ones of said bit lines and said first latch circuits, respectively; and a plurality of fourth switches coupled between said even ones of said bit lines and said second latch circuits, respectively, wherein, when data are read from selected ones out of said memory cells, said plurality of third switches and plurality of fourth switches are turned off and ones of said first and second switches between said selected memory cells and said first and second sense amplifiers are turned on.

8. A nonvolatile semiconductor memory device according to claim 6, wherein said word line is disposed between said first latch circuits and said second latch circuits.

9. A nonvolatile semiconductor memory device according to claim 7, wherein said word line is disposed between said first latch circuits and said second latch circuits.

10. A nonvolatile semiconductor memory device according to claim 6, wherein said word line is disposed between said first sense amplifier and said second sense amplifier.

11. A nonvolatile semiconductor memory device according to claim 7, wherein said word line is disposed between said first sense amplifier and said second sense amplifier.

12. A nonvolatile semiconductor memory device according to claim 8, wherein said word line is disposed between said first sense amplifier and said second sense amplifier.

13. A nonvolatile semiconductor memory device according to claim 9, wherein said word line is disposed between said first sense amplifier and said second sense amplifier.

14. A nonvolatile semiconductor memory device having memory cells including MOS transistors each having a floating gate and a control gate, each of said MOS transistors having a drain coupled to a bit line, comprising:

a sense amplifier for detecting and amplifying a signal of a memory cell read out on said bit line;

a transfer MOS transistor having a source-drain path coupled between said bit line and said sense amplifier;

first charging means for charging the drain or the source of said transfer MOS transistor which is coupled to said sense amplifier with a first voltage;

a voltage-applying means for applying a second voltage to a gate of said transfer MOS transistor; and second charging means for charging said bit line coupled to the source or the drain of said transfer MOS transistor which is coupled to said bit line with a third voltage lower than said second voltage by a threshold voltage of said transfer MOS transistor.

15. A nonvolatile semiconductor memory device according to claim 14, wherein:

said voltage-applying means changes the voltage applied to the gate of said transfer MOS transistor into a fourth voltage from the second voltage prior to activating said memory cell by applying a predetermined voltage to said control gate; and the fourth voltage is so set that an absolute value of its difference from the third voltage is smaller than the absolute value of the threshold voltage of said transfer MOS transistor.

16. A nonvolatile semiconductor memory device having a word line, a plurality of bit lines crossing said word line, and a plurality of memory cells including MOS transistors whose control gates are coupled to said word line and whose drains are coupled to said bit lines, respectively, each of the MOS transistors having a floating gate, said non-volatile semiconductor memory device comprising:

latch circuits coupled to said plurality of bit lines, respectively;

a sense amplifier coupled to said plurality of bit lines in common; and a plurality of first switches coupled to said plurality of bit lines, respectively, said plurality of first switches being disposed between said plurality of bit lines and said sense amplifier, respectively, wherein a MOS transistor of said latch circuit has a gate shorter than that of a MOS transistor of said sense amplifier.

17. A nonvolatile semiconductor memory device according to claim 16, further comprising:

second switches coupled between said plurality of bit lines and said latch circuits, respectively, wherein when data is to be read from a memory cell selected out of said plurality of memory cells, said second switches are turned off and one of said plurality of first switches between said selected memory cell and said sense amplifier is turned on.

18. A nonvolatile semiconductor memory device according to claim 17, wherein, when data in said latch circuits are written into said plurality of memory cells, said plurality of first switches are turned off and said second switches are turned on.

* * * * *